US006878993B2

(12) United States Patent
Yilmaz

(10) Patent No.: US 6,878,993 B2
(45) Date of Patent: Apr. 12, 2005

(54) SELF-ALIGNED TRENCH MOS JUNCTION FIELD-EFFECT TRANSISTOR FOR HIGH-FREQUENCY APPLICATIONS

(76) Inventor: Hamza Yilmaz, 20755 Trinity Ave., Saratoga, CA (US) 95070

( * ) Notice: Subject to any disclaimer, the term of this patent is extended or adjusted under 35 U.S.C. 154(b) by 260 days.

(21) Appl. No.: 10/327,325

(22) Filed: Dec. 20, 2002

(65) Prior Publication Data

US 2004/0232450 A1 Nov. 25, 2004

(51) Int. Cl.[7] .............................................. H01L 29/76
(52) U.S. Cl. .................. 257/330; 257/327; 257/328; 257/329; 438/270; 438/268; 438/269; 438/589
(58) Field of Search ................................ 257/327–330; 438/270, 268–269, 589

(56) References Cited

U.S. PATENT DOCUMENTS 6,784,486 B2 * 8/2004 Baliga ........................ 257/327

FOREIGN PATENT DOCUMENTS

JP          60-226185      11/1985

* cited by examiner

*Primary Examiner*—Luan Thai
(74) *Attorney, Agent, or Firm*—Silicon Valley Patent Group LLP

(57) ABSTRACT

A trench JFET includes sidewall oxide spacers at the top of the gate trench and oxide spacers at the bottom of the trench. The source terminal is located at the top surface of the chip and the drain is located at the bottom surface of the chip. The gate may include doped polysilicon, a Schottky metal, or a combination thereof. The sidewall spacers and the top of the trench increase the packing density of the device, and the spacers at the bottom of the trench reduce the gate-to-drain capacitance and prevent dopant from the gate from spreading downward towards the drain. This allows the epitaxial layer to be very thin. The JFET can be operated at high frequency and requires a very low gate drive. It is well suited, therefore, for use in a switch-mode DC—DC converter.

31 Claims, 29 Drawing Sheets

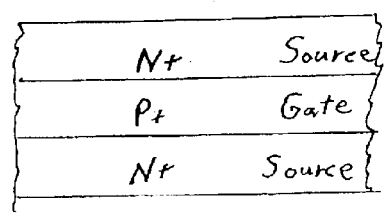
Fig. 13A
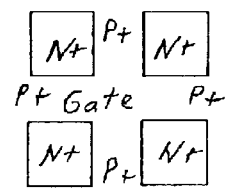
Fig. 13B
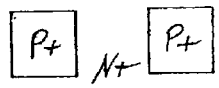
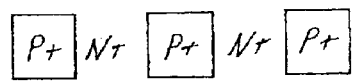
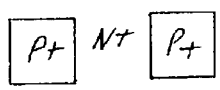
Fig. 13C

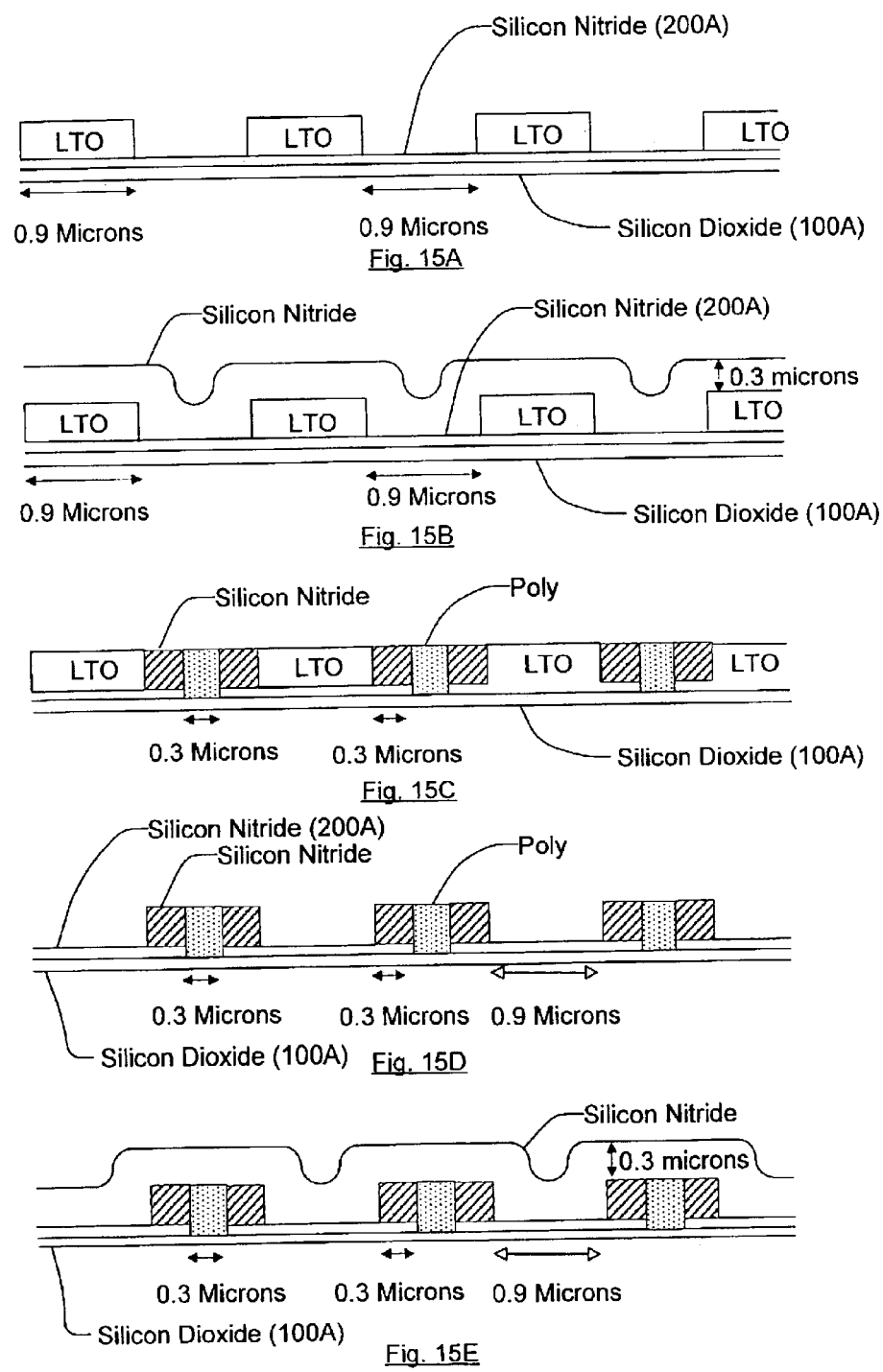

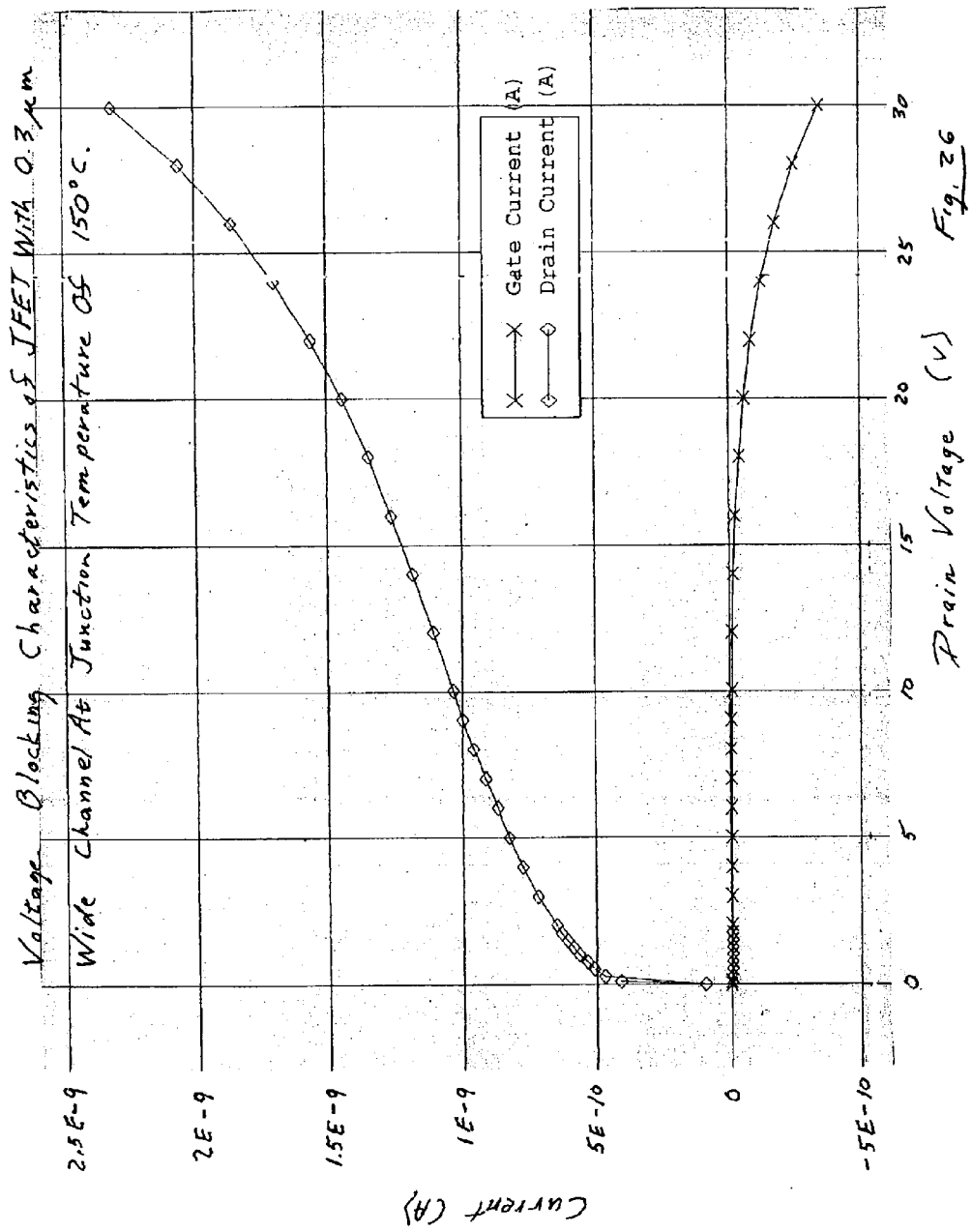

SELF-ALIGNED TRENCH MOS JUNCTION FIELD-EFFECT TRANSISTOR FOR HIGH-FREQUENCY APPLICATIONS

FIELD OF THE INVENTION

This invention relates to power switching devices and particularly to a switching device that minimizes power dissipation at high frequencies.

BACKGROUND OF THE INVENTION

The power supplies of the next generation of central processing units (CPUs) will require switching-mode DC—DC converters that operate at very high frequencies and supply high levels of current. For example, such a DC—DC converter might be required to operate at a frequency of 1–4 MHz and supply a current of 50–60 A for laptop CPUs and 90–100 A for desktop CPUs. The structure and operation of switching-mode DC—DC converters is well known and several examples are described, for example, in U.S. Pat. No. 6,031,702, incorporated herein by reference in its entirety.

An analysis of the total power loss of both the upper and lower power switches in a step-down DC—DC buck converter is described in Wen Wei et al., "Desktop Voltage Regulator, Power/Thermal Solutions", Intel Technology Symposium, Aug. 28–29, 2002.

The amount of power dissipated in a field-effect transistor (FET) switch in a high-frequency DC—DC converter is dominated by (i) switching (on/off) losses and (ii) gate drive losses. These losses are governed by the following formulas:

Switching losses:

$$P_{switch} = \frac{1}{2} V_{in} I_{out} t_{on} f$$

where $V_{in}$ is the input (supply) voltage, I is the output current, f is the switching frequency, and $t_{on}$ is the switching time of the device. i.e., the time it takes the device to switch from "on" to "off". Of these parameters only $t_{on}$ is determined by the characteristics of the device. The other parameters are controlled by the application.

Gate drive losses:

$$P_{gate} = \frac{1}{2} C V_{gs}^2 f$$

where $P_{gate}$ is the power loss in the gate drive of the switch, C is the input capacitance of the switch, $V_{gs}$ is the voltage that charges the capacitance (i.e., the voltage required to switch the power device on and off), and f is the operating frequency.

As the formula indicates, the "gate drive power loss" of the switch is directly proportional to the input capacitance and operating frequency and to the square of the voltage. Therefore, to reduce the power loss when the operating frequency is increased, it is necessary to reduce the voltage and the input capacitance. It is particularly important to reduce the voltage, since a reduction of the voltage by a factor of 4, for example, reduces the power loss by a factor of 16. Voltage-scaling is therefore a key element in the design of very high-frequency DC—DC converters.

As indicated in the above-referenced U.S. Pat. No. 6,031,702, MOSFETs are typically used to perform the power switching function in DC—DC converters. A typical MOSFET might require a gate drive of 4 to 5 V to switch it on and off. This voltage level leads to unduly high power losses, however.

Another possibility would be to perform the switching function with a junction field-effect transistor (JFET), shown in cross-section in FIGS. 1A and 1B. JFET 10 includes an N+ source region 102, and N+ drain region 104 and P+ gate 106, which are formed as opposing regions separated by an N− channel region 108. While P+ gate 106 is shown as two separate regions, it is understood that they are electrically connected in the third dimension outside the plane of the paper. The width of channel region 108 is designated $X_W$. The input capacitance $C_{in}$ of JFET 10 is equal to:

$$C_{in} = C_{gs} + C_{gd}$$

where $C_{gs}$ equals the capacitance between P+ gate 106 and N+ source region 102 and $C_{gd}$ equals the capacitance between P+ gate and N+ drain region 104.

If N+ source region 102 abuts P+ gate 106, as shown in FIG. 1A, $C_{gs}$ is high, and as a result the input capacitance of the device is very high. As indicated above, this is not acceptable.

On the other hand, if N+ source region 102 is separated from P+ gate by a distance $X_S$, as shown in FIG. 1B, $C_{gs}$ is reduced, but the channel width $X_W$ is increased by an amount equal to $2X_S$. This reduces the packing density of the device, reducing the total channel width per unit area and increasing the on-resistance $R_{ds}$on. Moreover, the pinch-off voltage $V_{Gp}$ is proportional to the square of the channel width $X_W$.

$$V_{Gp} \propto X_W^2$$

Therefore, increasing the channel width $X_W$ by $2X_S$ increases the pinch-off voltage and this in turn leads to greater switching losses.

Furthermore, when the P+ gate 106 is forward-biased with respect to the N-channel region 108, holes are injected from P+ gate 106 into N-channel region 108. This additional stored charge increases $C_{in}$ by roughly an order of magnitude and slows down the switching speed and increases the power dissipated in the device. Also, when the load is inductive, $C_{gd}$ becomes very high. For these reasons, a JFET is generally considered to be a less desirable device than a MOSFET for performing the power switching function in high-frequency DC—DC converters.

Accordingly, it would be desirable to develop a switching device that has a low input capacitance and that can be switched on and off by at a significantly lower voltage than is possible with conventional MOSFETs and JFETs.

SUMMARY OF THE INVENTION

A JFET in accordance with this invention includes a substrate and an epitaxial layer generally doped with impurities of a first conductivity type and a plurality of trenches extending partially or entirely through the epitaxial layer. A source region is located at the upper surface of the epitaxial layer in a mesa between two of the trenches. A gate is located in the trenches. Insulating sidewall spacers are located on the upper portions of the sidewalls of the trenches between the gate and the mesa. In some embodiments a second insulating spacer is located at the bottom of the trenches. The second insulating spacer may include a horizontal section that extends along the bottom of the trench and vertical sections that extend upward along the sidewalls of the trench, or in some versions may include only the vertical sections that extend upward along the sidewalls of the trench. In some versions, the second insulating spacer is a layer of insulating material lying on the bottom of the trench and having a generally flat upper surface.

The gate itself may include a semiconductor material such as polysilicon doped with impurities of a second conductivity type opposite to the first conductivity type or a "Schottky metal" (i.e., a metal having a work function that is greater than the work function of the abutting semiconductor material in the mesa) or a combination of a doped semiconductor material and a Schottky metal.

Preferably, the trenches and the mesa between the trenches are relatively narrow (e.g., 0.2 μm to 0.6 μm wide). The invention also includes a method of fabrication such narrow features using equipment that normally is capable of fabricating devices having larger feature sizes. The method involves the fabrication of sidewall spacers on features that are obtained using the normal resolution power of the equipment.

The invention also includes a method of fabricating a JFET. The method includes forming a trench in a semiconductor material, forming insulating spacers on the sidewalls of the trench; extending the trench downward into the semiconductor material; depositing a mask material on the sidewalls of the extended trench; extending the trench further downward into the semiconductor material; and forming a bottom insulating spacer.

A JFET in accordance with this invention can be densely packed and can be turned on and off with a change in gate voltage of 0.6 V or less, for example. The gate-to-drain capacitance is minimized by the insulating spacer at the bottom of the trench, and therefore the device is capable of operating at very high frequencies, such as are required in a DC—DC converter.

BRIEF DESCRIPTION OF THE DRAWINGS

FIGS. 13A–13C is a plan view of several geometries that may be used in JFETs of this invention.

FIGS. 15A–15lH illustrate a process by which a 0.9 μm fab can be used to fabricate a device having trenches 0.3 μm wide separated by mesas 0.6 μm wide.

FIG. 26 is a graph of the drain current and the gate current as a function of drain voltage in the device in FIG. 3 at a junction temperature of 150° when the gate and source electrodes are shorted together. The net channel width between two P+ gates is 0.3 micron. (Voltage blocking mode/JFET switch is OFF)

DESCRIPTION OF THE INVENTION

Figure 1A:
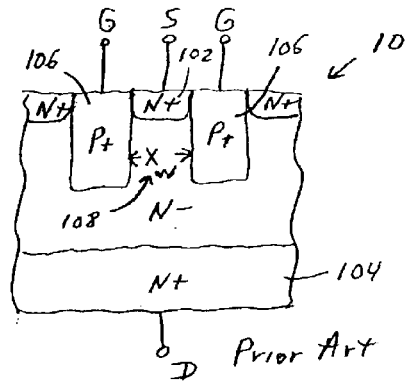
FIGS. 1A and 1B are cross-sectional views of two versions of a conventional JFET.
Figure 1B:
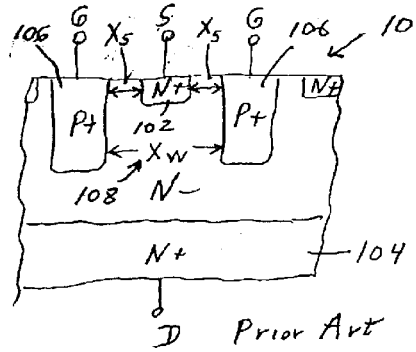
Figure 2:
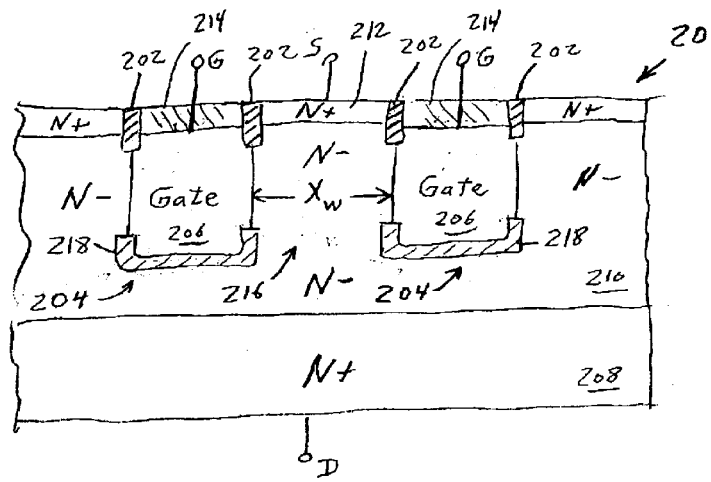
FIG. 2 is a general cross-sectional view of a JFET in accordance with this invention.

In a JFET according to this invention, the gate region is separated from the source region by an insulating spacer, preferably an oxide. A general conceptual view is shown in FIG. 2. JFET 20 is formed in an N− epitaxial (epi) layer 210 that is grown on top of an N+ substrate 208, which constitutes the drain. A gate 206 is formed in trenches 204, which extend downward into N− epi layer 210. As described below, gate 206 can take a variety of forms. A layer 214 of low-temperature oxide (LTO) overlies P+ gate 206. A channel region 216 separates trenches 204. Oxide spacers 202 are formed on the walls of trenches 204 and separate gate 206 from an N+ source region 212. Oxide spacers 202 reduce the capacitance between gate 206 and N+ source region 212 and yet allow gate 206 and N+ source region 212 to be in close proximity to each other, increasing the packing density of JFET 20. $X_W$ does not have to be increased, as described above, to ensure a separation between gate 206 and N+ source region 212. Therefore, the pinch-off voltage $V_{Gp}$ can be maintained at a lower level than is possible if $X_W$ must be increased to provide a separation between the N+ source region and the P+ gate.

The capacitance between gate 206 and N+ source region 212 is a function of the thickness of oxide spacers 202 and is determined in accordance with the following formula:

$$C_{gs} \cong \left(\frac{\varepsilon_{ox}}{t_{gox}}\right) \cdot A_{goxn+}$$

where $\varepsilon_{ox}$ is the permittivity of oxide, $t_{gox}$ is the thickness of the thickness of oxide spacers 202, and $A_{goxn+}$ is the area of the overlap between the N+ source and the spacer.

In addition, an insulating layer 218, preferably oxide, is formed on the bottoms and lower sidewalls of trenches 204. Oxide layer 218 reduces the capacitance between gate 206 and N–epi (N drain) region 208, particularly when the junction between gate 206 and N drain region 208 is forward-biased to turn on JFET 20. Oxide layer 218 allows the N– epi layer 210 to be made thinner, reducing the on-resistance of the device.

FIGS. 3–10 illustrate several alternative embodiments according to this invention.

Figure 3:
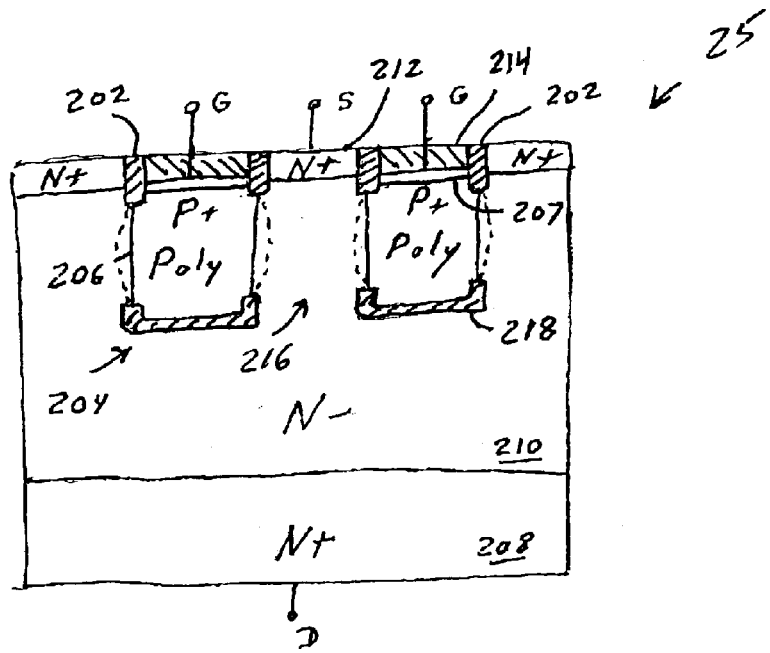
FIG. 3 is a cross-sectional view of a JFET of this invention having a polysilicon gate.

In JFET 25, shown in FIG. 3, gate 206 is formed of heavily doped P+ polysilicon overlain by a layer 207 of Ti/TiN or tungsten to reduce the sheet resistivity of the gate. The P-type ions from gate 206 diffuse laterally into channel region 216, as indicated by the dashed lines, but oxide layer 218 prevents the P– type ions from diffusing through the bottom of trench 204. Oxide layers 202 and 218 could be 500–2000 Å thick, for example. N– epi layer could be 1.0–5.0 μm thick, depending on the require breakdown voltage.

Figure 4:
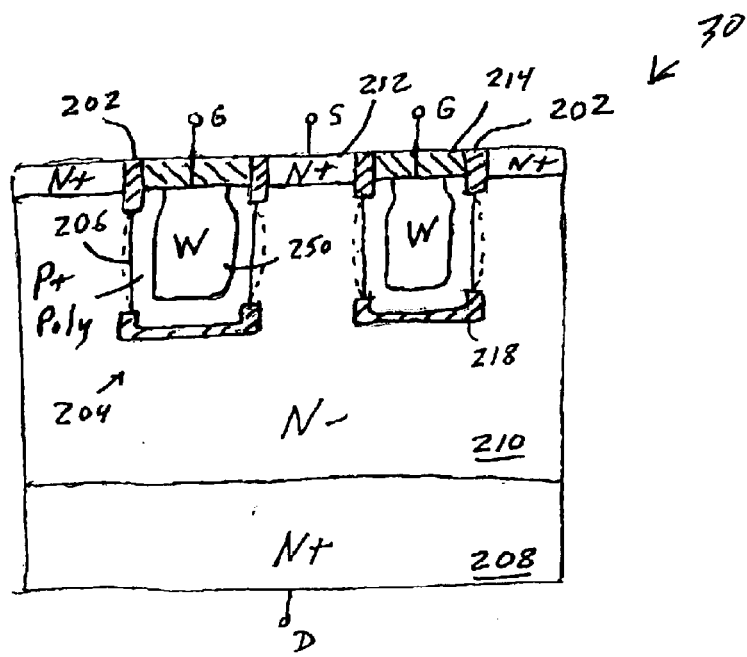
FIG. 4 is a cross-sectional view of a JFET of this invention having a gate with a Schottky metal core.

In JFET 30, shown in FIG. 4, gate 206 has a core 250 of tungsten, titanium, molybdenum, platinum or another "metal", surrounded by heavily-doped P-type polysilicon. The metal reduces the internal resistance of the gate.

Figure 5:
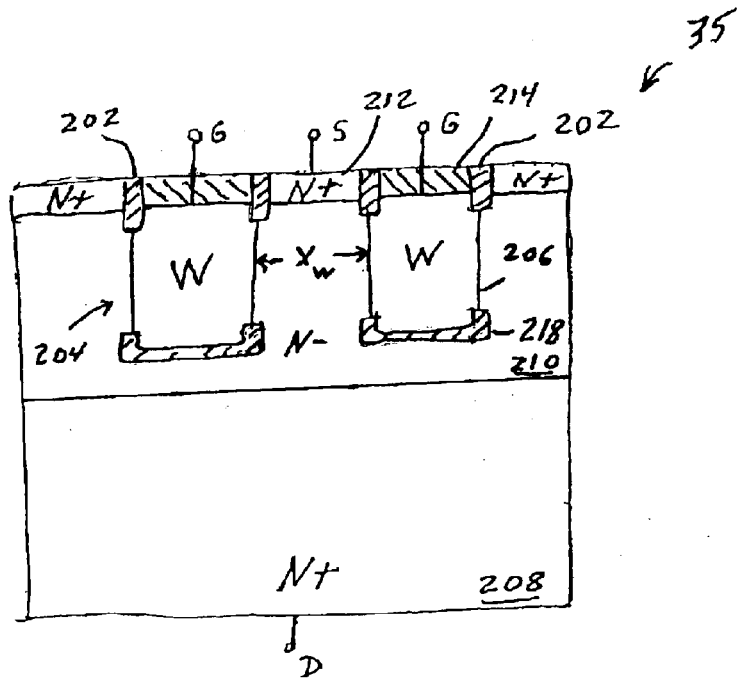
FIG. 5 is a cross-sectional view of a JFET of this invention having a Schottky metal gate.

In JFET 35, shown in FIG. 5, gate 206 is formed entirely of a Schottky metal such as tungsten, titanium, molybdenum, platinum or another "Schottky metal" whose work function $\Phi_{DM}$ is greater than the work function $\Phi_S$ of the abutting semiconductor material,. $X_W$ could be 0.2–0.3 μm. The distance between the bottoms of trenches 204 and the interface between N+ substrate 208 and N– epi layer 210 could be 1.0–5.0 μm or even higher, depending on the required breakdown voltage.

Figure 6:
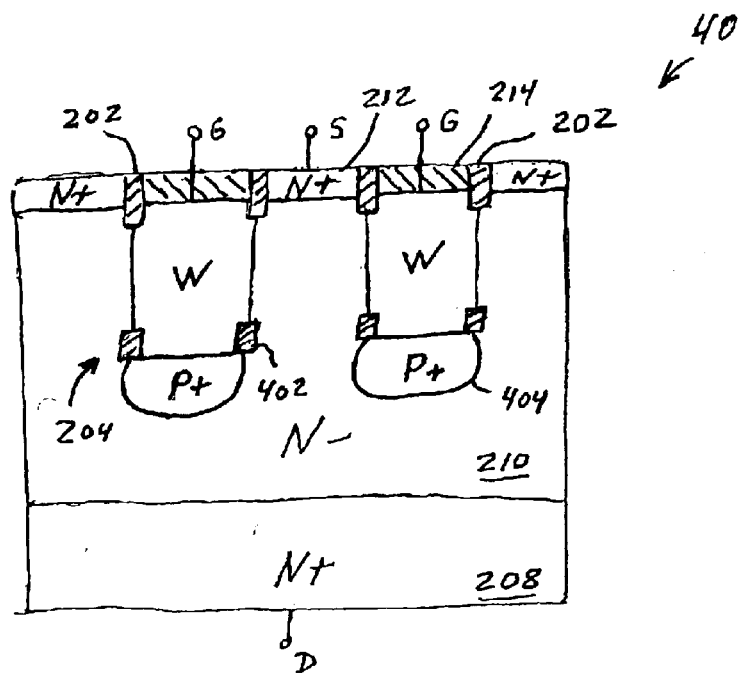
FIG. 6 is a cross-sectional view of a JFET of this invention having a Schottky metal gate and lacking an insulating spacer at the bottom of the trench

JFET 40, shown in FIG. 6, is a hybrid Schottky and junction gate JFET that is particularly well suited for use in high-voltage applications. As with JFET 35, trenches 204 are filled with tungsten or another Schottky metal. Oxide sidewall spacers 402 are formed along the sidewalls at the bottom of trenches 204, but unlike oxide layers 218 they do not extend along the bottoms of trenches 204. A heavily-doped P+ region is formed by implantation and diffusion in epi layer 210 directly below trenches 204.

Figure 7:
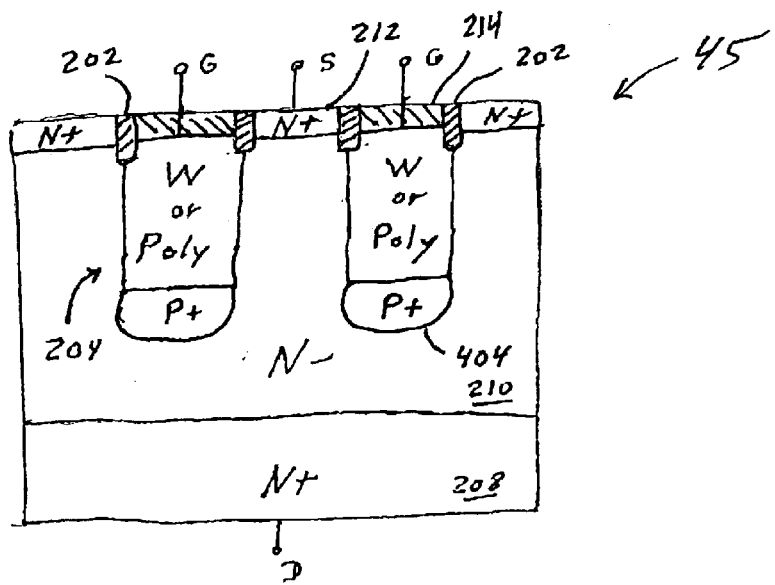
FIG. 7 is a cross-sectional view of a JFET of this invention having a metal or polysilicon gate and a heavily doped region below the trench and lacking an insulating spacer at the bottom and lower sidewalls of the trench.

JFET 45, shown in FIG. 7, is another hybrid Schottky and junction gate JFET. Oxide spacers are omitted at the bottoms of trenches 204, and trenches 204 are filled with a Schottky metal or P+ polysilicon.

Figure 8:
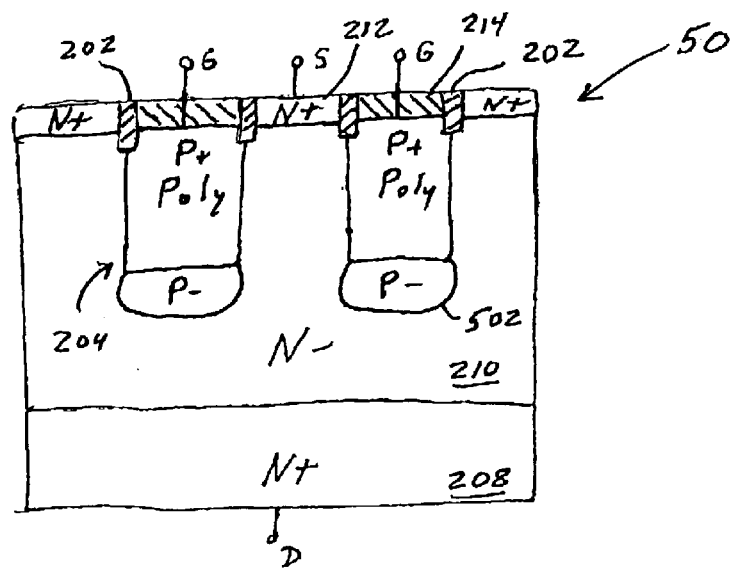
FIG. 8 is a cross-sectional view of a JFET of this invention having a polysilicon gate and a lightly-doped region below the trench and lacking an insulating spacer at the bottom and lower sidewalls of the trench.

JFET 50, shown in FIG. 8, is similar to JFET 45 except that trenches 204 are filled only with P+ polysilicon, and lightly-doped P– regions 502 are formed by implantation and diffusion in the epi layer 210 directly below trenches 204 which is well suited for high voltage applications with thicker N– epi layer. For example, for a 500V device the thickness of the N– epi layer can be as much as 40 μm.

Figure 9:
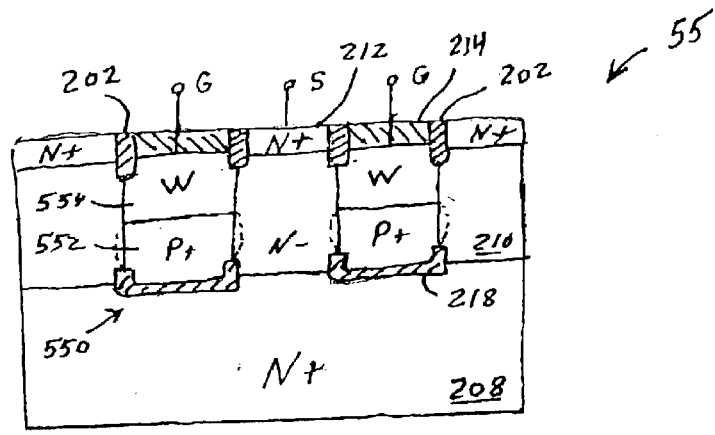
FIG. 9 is a cross-sectional view of a JFET of this invention having a gate that includes a Schottky metal layer overlying a polysilicon layer.

JFET 55, shown in FIG. 9, differs from the devices shown in FIGS. 3–8 in that trenches 550 extend entirely through N– epi layer 210 and project into N+ substrate 208. Trenches 550 are filled with P+ polysilicon 552 and a Schottky metal 554 such as tungsten. JFET 55 has a very low on-resistance and is therefore suitable for low-voltage (e.g., ≦10V) applications.

Figure 10:
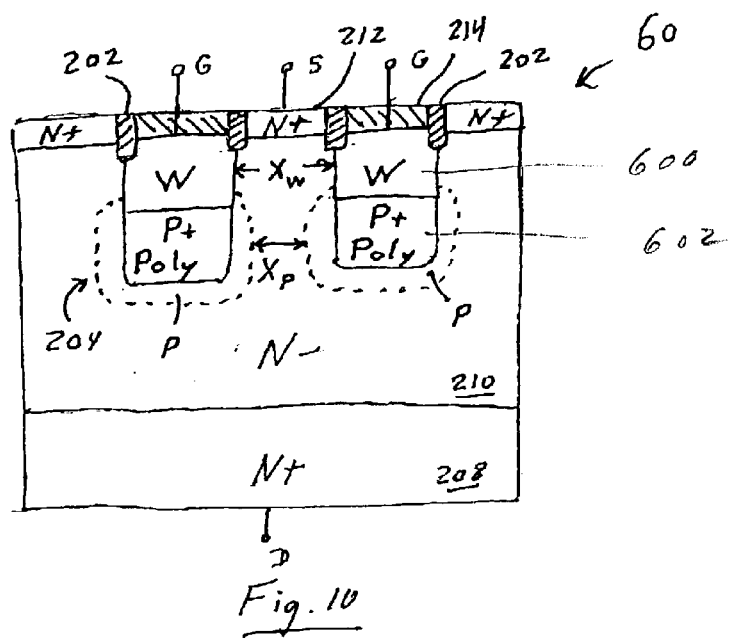
FIG. 10 is a cross-sectional view of a JFET of this invention having a gate that includes a metal layer overlying a polysilicon layer and lacking an insulating spacer and the bottom and lower sidewalls of the trench.

JFET 60, shown in FIG. 10, is suitable for high-voltage applications. Trenches 204 are filled in a manner similar to trenches 550 in JFET 55, with a layer 600 of tungsten or another Schottky metal and a layer 602 of P+ polysilicon, but trenches 204 do not extend into N+ substrate 208 and bottom oxide layer 218 is omitted. Therefore, the diffusion of P-type ions from P+ polysilicon layer 602 results in the P regions, denoted by the dashed lines, that surround the lower portions of trenches 204 and increase the breakdown potential of the device.

The P regions are separated by a distance $X_P$ that is less than the distance $X_W$ between trenches 204. When the device is "pinched off", $X_P$ is equal to the width of two depletion regions, one extended from each P region. The value of $X_P$ required to keep the device turned off thus depends on the background doping concentration of the N– epi layer between the trenches 204. When tungsten is the Schottky metal, starting with the following formula for the width $X_{P/2}$ for one of the depletion regions, $$X_{P/2} = \left(\frac{2\varepsilon_S}{qN_D} \cdot V_B\right)^{\frac{1}{2}}$$

where $\varepsilon_S$ is the permittivity of silicon, q is the charge of an electron, and $V_B$ is the built-in diode potential (≈0.45 V at 150° C.), it can be shown that $X_P$ is related to the background doping concentration $N_D$ as follows:

$$X_P \cong 1.677\left(\frac{2 \times 10^{14}}{N_D}\right)^{\frac{1}{2}}$$

Figure 11:
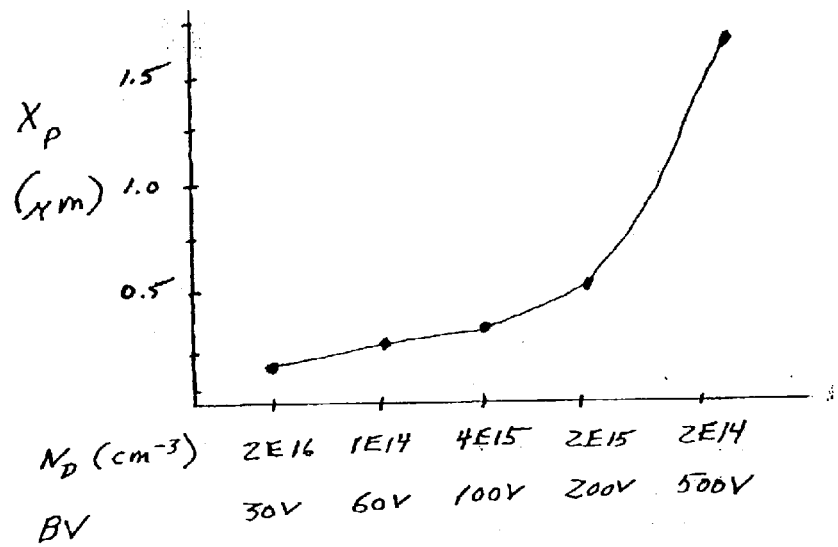
FIG. 11 is a graph showing the required spacing between the P+ regions of the device shown in FIG. 10 as a function of the background doping concentration and breakdown voltage.

FIG. 11 is a graph showing the required separation $X_P$ to keep the device off at 150° C. for various values of $N_D$ and the corresponding breakdown voltage BV. As indicated, $X_P$ varies from 1.677 μm for a device having a breakdown voltage of 500 V to 0.1677 μm for a device having a breakdown voltage of 30V.

To turn the device on, the gate must only be biased to overcome the built-in diode potential of 0.3–0.65V for a Schottky diode and 0.5–0.8V for PN junction gates. The device structures shown in FIGS. 3–10 enable the manufacturing of optimized devices with performance for different applications ranging from low voltage-high speed to high voltage-low speed power switching applications.

The doping concentrations of the P+ regions 404 in FIGS. 6 and 7 could be in the range of $5 \times 10^{17}$ to $1 \times 10^{20}$ cm$^{-3}$. The doping concentration of P region 502 could be in the range of $3 \times 10^{13}$ to $1 \times 10^{17}$ cm$^{-3}$.

Figure 12:
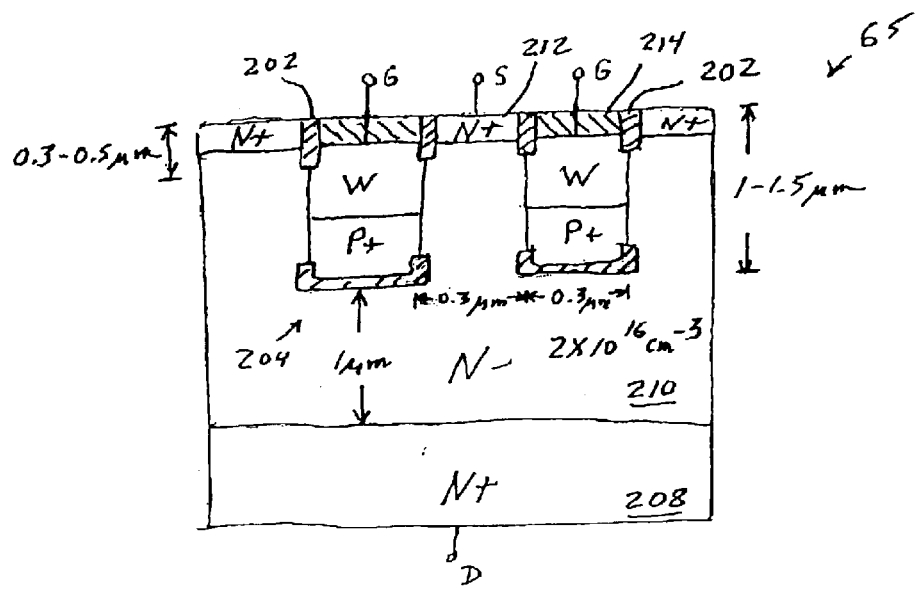
FIG. 12 is a cross-sectional view showing illustrative dimensions of a JFET in accordance with this invention.

FIG. 12 shows some illustrative parameters for a low-voltage JFET 65. Trenches 204 are 1–1.5 μm deep and 0.3 μm and are separated by 0.3 μm. The bottoms of trenches 204 are about 1 μm from the interface between N– epi layer 210 and N+ substrate 208. Oxide spacers 202 are 0.3–0.5 μm deep and oxide layer 212 is about 0.3 μm thick.

The geometry of the JFETs shown in FIGS. 3–10 may take various forms. One preferred embodiment is the stripe geometry shown in FIG. 13A, with the sources alternating with the gates. An alternative is a closed cell geometry such as shown in FIGS. 13B and 13C, with source "islands" separated by gate regions. The closed cells could be square, hexagonal or circular. One could also have gate "islands" separated by source regions, but then it would be necessary to connect all of the gate islands.

Figure 24:
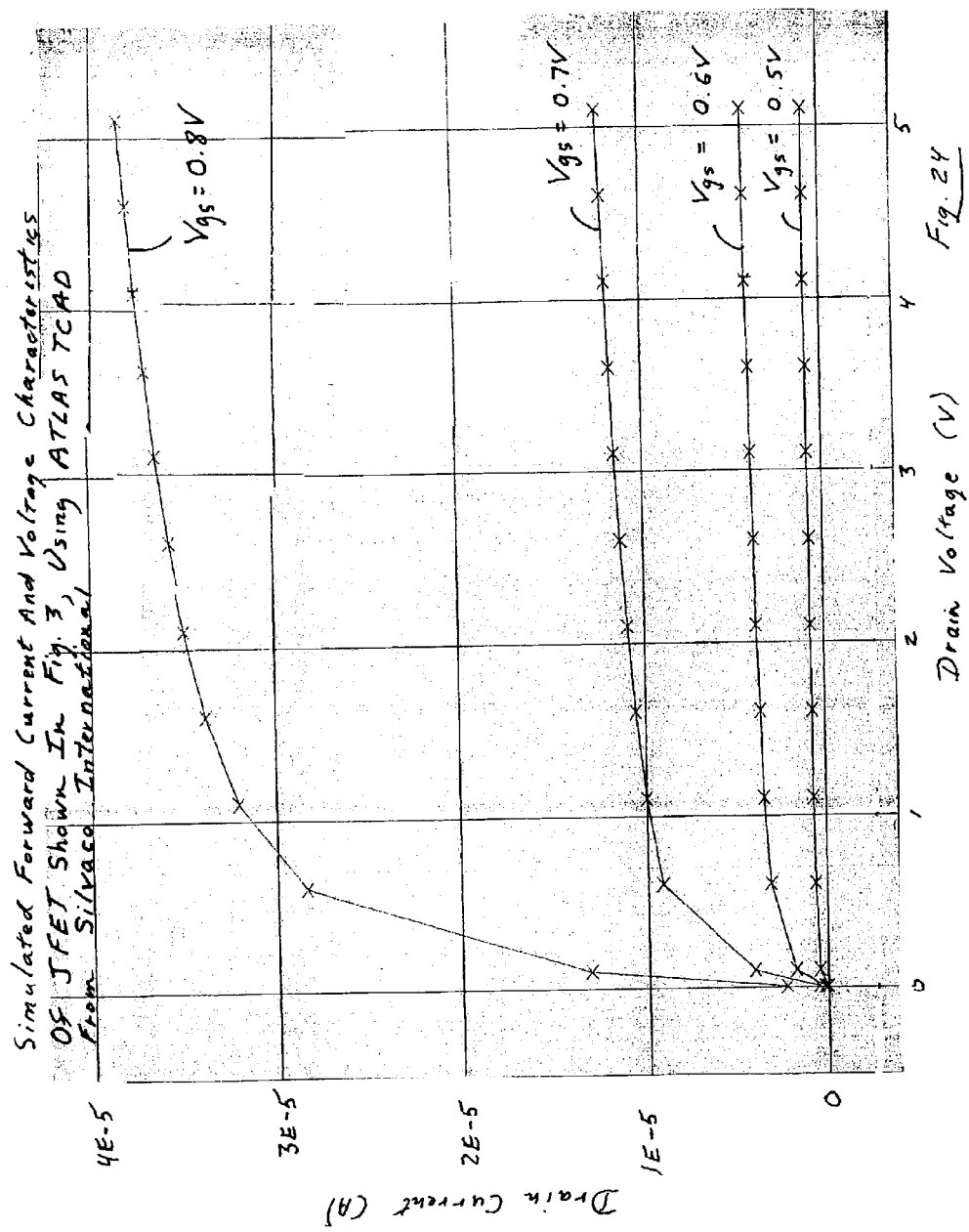
FIG. 24 is a graph of the drain current as a function of the drain voltage at several gate voltages in a device structure according to this invention as shown in FIG. 3.
Figure 25:
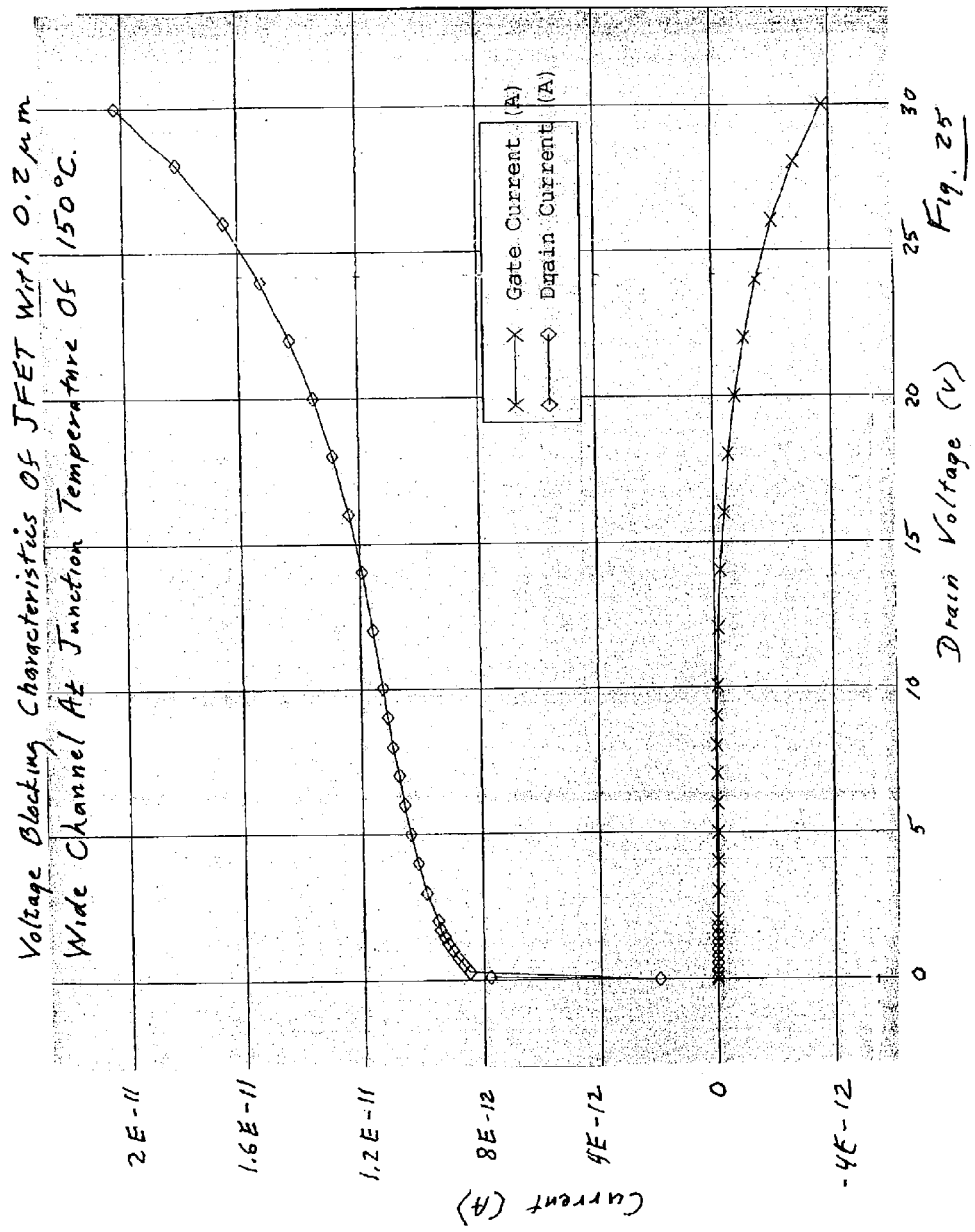
FIG. 25 is a graph of the drain current and the gate current as a function of drain voltage in the device in FIG. 3 at a junction temperature of 150° C. when the gate and source electrodes are shorted together. The net channel width between the two P+ gates is 0.2 micron. (Voltage blocking mode/JFET switch is OFF)

FIGS. 24, 25 and 26 are graphs of several characteristics of the JFET structure shown in FIG. 3 which were obtained by using the 2D device simulation program ATLAS, available from Silvaco International.

FIG. 24 shows the drain current at 25 Deg. C, as a function of the drain voltage at gate voltages ($V_{gs}$) ranging from 0.5 V to 0.8 V. The trench depth was 1.35 μm, the mesa width was 0.3 μm and the channel was doped at $1.5 \times 10^{16}$ cm$^{-3}$.

FIG. 25 shows the drain and gate currents as a function of the drain voltage with shorted gate and source for a structure with net channel width of 0.2 micron at 150° C. junction temperature.

FIG. 26 shows the drain and gate currents as a function of the drain voltage with shorted gate and source for a structure with net channel width of 0.3 micron at a 150° C. junction temperature.

In many embodiments, particularly those designed to operate at low voltages, it is advantageous to have very narrow source mesas and gates. For example, as shown in FIG. 12, the source mesas and the gates could each be only 0.3 μm wide. In many cases a fab that is capable of manufacturing features of this size is not available to the designer of power devices. Such a fab might cost in the range of billions of dollars. FIGS. 14A–14H, 15A–15H and 16A–16E illustrate several techniques of fabricating very small source mesas and gates and other features using a fab that is designed for a larger feature size.

FIGS. 14A–14H illustrate a process by which 0.3 μm trenches and mesas may be formed using equipment that is capable of producing a 0.6 μm feature size.

Figure 14A:
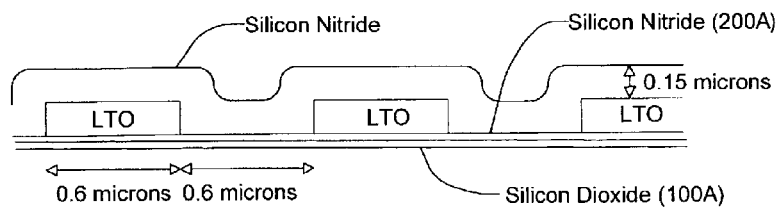
FIGS. 14A–14H illustrate a process by which a 0.6 μm fab can be used to fabricate a device having trenches 0.3 μm wide separated by mesas 0.3 μm wide.

As shown in FIG. 14A, a silicon dioxide layer and a silicon nitride layer are initially deposited on the substrate. The silicon dioxide layer may be 100 Å thick and the silicon nitride layer may be 200 Å thick. A low-temperature oxide (LTO) layer is deposited by chemical vapor deposition (CVD) to a thickness of 0.5–1.0 μm, for example. Using standard photolithographic techniques, the LTO layer is patterned and etched to form 0.6 μm segments separated by 0.6 μm gaps. Following the growth of a thin silicon dioxide buffer layer (100–200 Å thick), a silicon nitride ($Si_3N_4$) layer is deposited over the structure conformally by CVD. The silicon nitride layer may be 200–500 Å thick, for example.

Figure 14B:
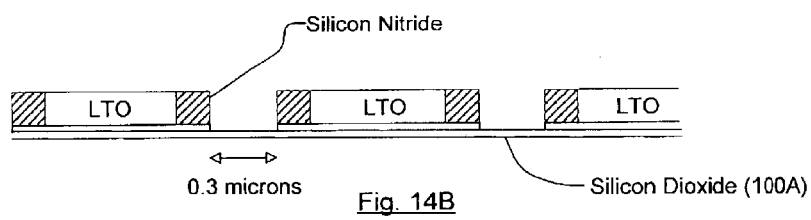

The silicon nitride layer is etch using an anisotropic process such as reactive ion etching (RIE). This leaves spacers on the sidewalls of the LTO layer, as shown in FIG. 14B. The sidewall spacers may have a horizontal thickness of 0.15 μm, leaving a series of gaps about 0.3 μm wide.

Figure 14C:
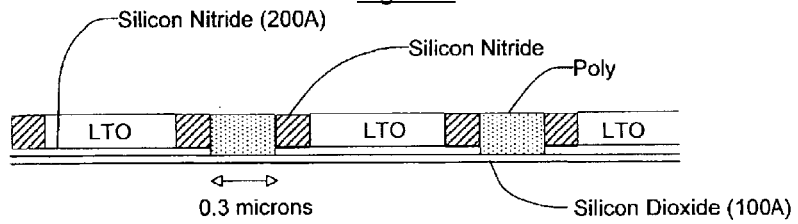
Figure 14D:
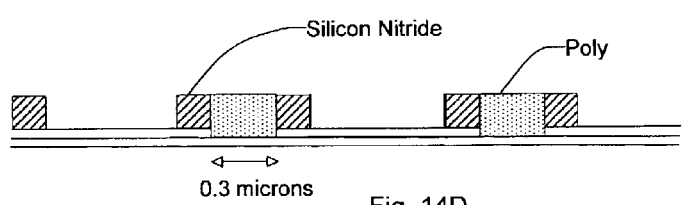

A layer of polysilicon is then deposited by CVD and is planarized to fill the gaps, as shown in FIG. 14C. The LTO layer is then removed by an etchant such as buffered HF (HF diluted with deionized water) which does not significantly etch the silicon nitride or polysilicon. This leaves the structure shown in FIG. 14D.

Figure 14E:
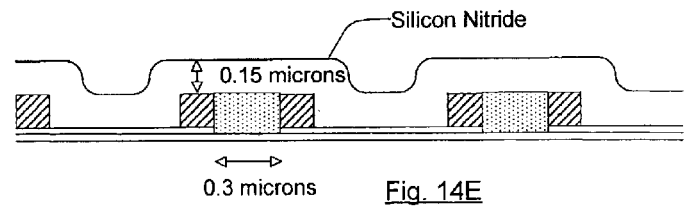
Figure 14F:
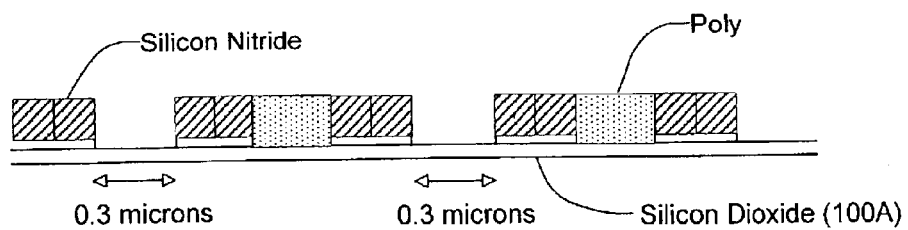

Another layer of silicon nitride is deposited by CVD, as shown in FIG. 14E, and this layer is subjected to a directional RIE etch which leaves a second set of sidewall spacers on the sidewalls of the previously formed silicon nitride sidewall spacers. Assuming again, that these spacers measure about 0.15 μm laterally, a series of 0.3 μm wide gaps are formed, as shown in FIG. 14F. To form a well defined sidewall spacer, chemical mechanical polishing (CMP) can be used before the RIE.

Figure 14G:
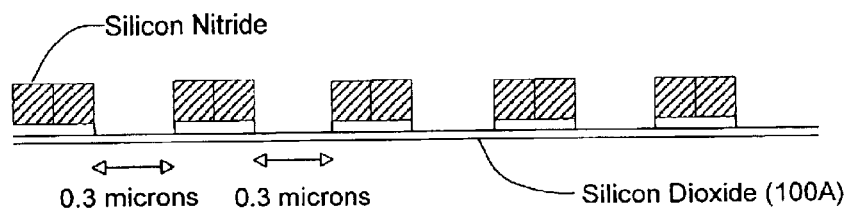

The polysilicon layer is then removed with a plasma etch using a well-known chemistry such as $SF_6$, which does not significantly affect the silicon nitride. This leaves a trench mask as shown in FIG. 14G, with 0.3 μm wide segments of silicon nitride separated by 0.3 μm wide gaps.

Figure 14H:
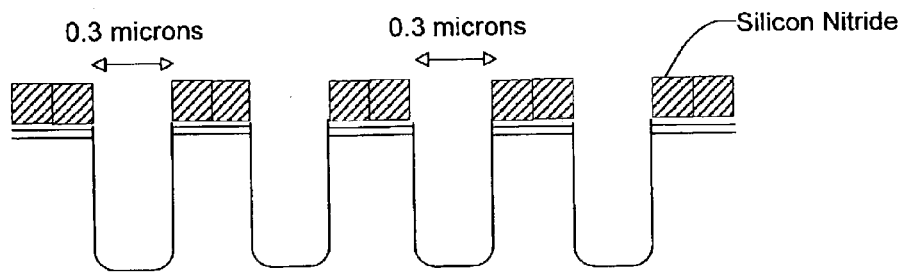

The underlying substrate can then be etched through the gaps in the silicon nitride layer, using an RIE process, for example, to form trenches that are 0.3 μm wide and are separated by 0.3 μm wide mesas. This structure is shown in FIG. 14H. The silicon nitride mask and the silicon dioxide buffer layer may then be removed.

Figure 15F:
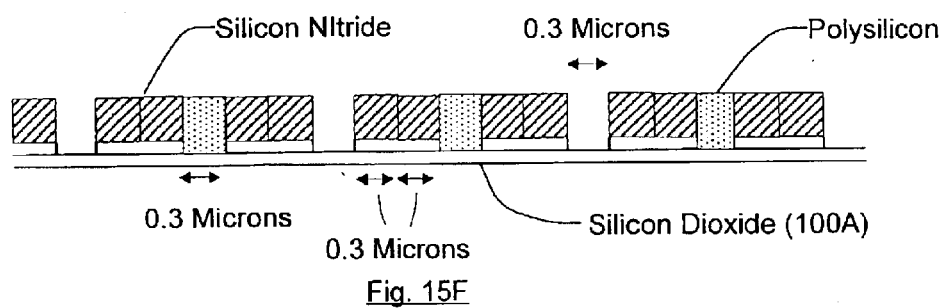

FIGS. 15A–15H illustrate a process by which a 0.9 μm fab may be used to produce 0.3 μm wide trenches separated by 0.6 wide mesas. Again, as shown in FIG. 15A, the process begins with the deposition of an LTO layer, which may be 1.0 μm thick, on a thin (e.g., 100 Å thick) silicon dioxide and thin (e.g., 200 Å thick) silicon nitride buffer layer. The LTO layer is patterned, using conventional photolithograph means, into 0.9 μm segments separated by 0.9 μm gaps.

As shown in FIG. 15B, a silicon nitride layer is deposited by CVD on top of this structure. The silicon nitride layer may be 0.3 μm thick, for example. The silicon nitride layer is etched directionally, preferably using RIE, leaving sidewall spacers on the vertical walls of the LTO layer. Each of these sidewall spacers has a lateral dimension of about 0.3 μm, leaving gaps of about 0.3 μm. A layer of polysilicon is then deposited and planarized, filling the gaps as shown in FIG. 15C.

The LTO layer is then removed, using an etchant that does not significantly affect the silicon nitride and polysilicon, yielding the structure shown in FIG. 15D with gaps of about 0.9 μm between the remaining portions of the silicon nitride and polysilicon layers.

Another layer of silicon nitride is deposited conformally over the structure, as shown in FIG. 15E. This silicon nitride layer is etched directionally, producing a second set of sidewall spacers on the previously formed silicon nitride sidewall spacers. As shown in FIG. 15F the resulting structure includes polysilicon plugs each of which has two silicon nitride spacers on each side. The polysilicon/silicon nitride structures are separated by spaces approximately 0.3 μm wide.

Figure 15G:
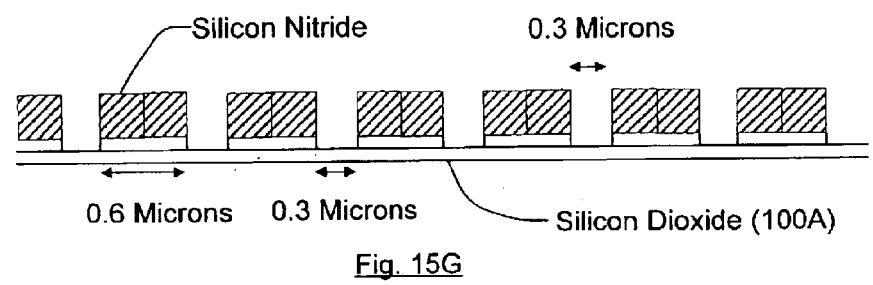
Figure 15H:
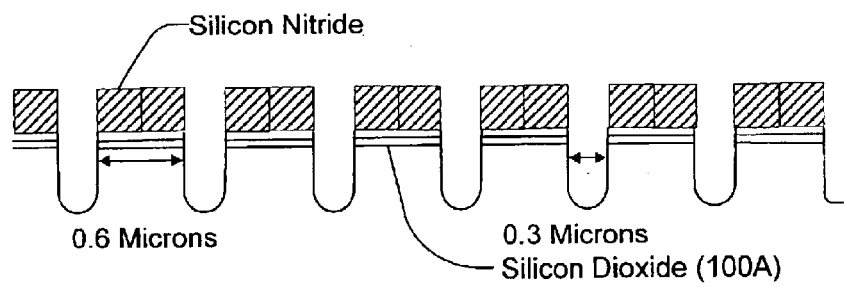
Figure 16E:
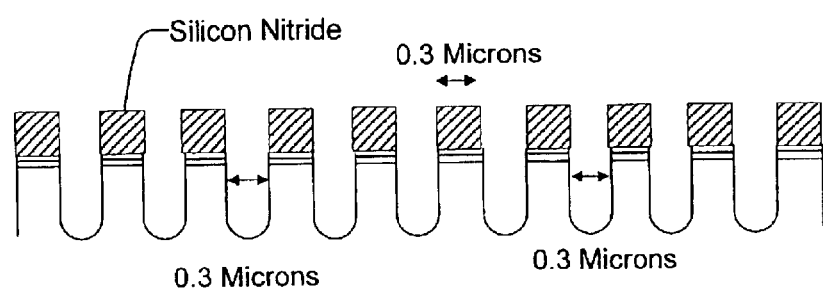
FIGS. 16A–16E illustrate a variation of the process shown in FIGS. 15A–15H by which a 0.9 μm fab can be used to fabricate a device having trenches 0.3 μm wide separated by mesas 0.3 μm wide.
Figure 16E:
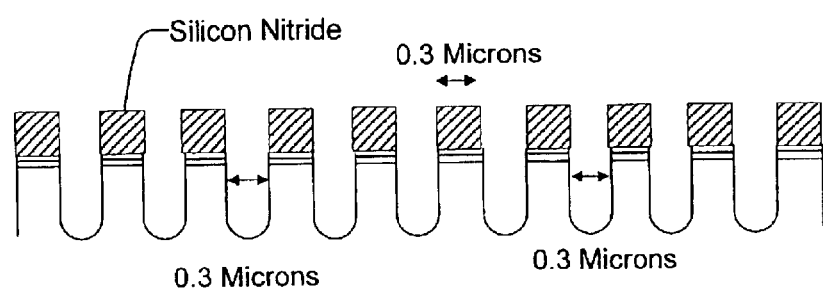

The remaining polysilicon is then removed, yielding the structure shown in FIG. 15G. Only the silicon nitride sidewall spacers remain and each contiguous pair is 0.6 μm wide and is separated by a gap about 0.3 μm wide. Trenches are etched through the gaps, producing the structure shown in FIG. 15H, with 0.3 wide trenches separated by 0.6 μm wide mesas.

Figure 16A:
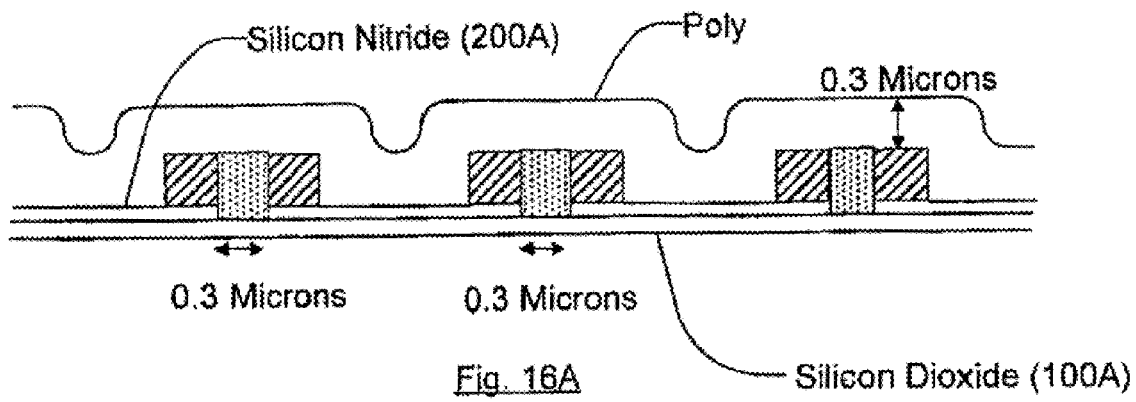
Figure 16B:
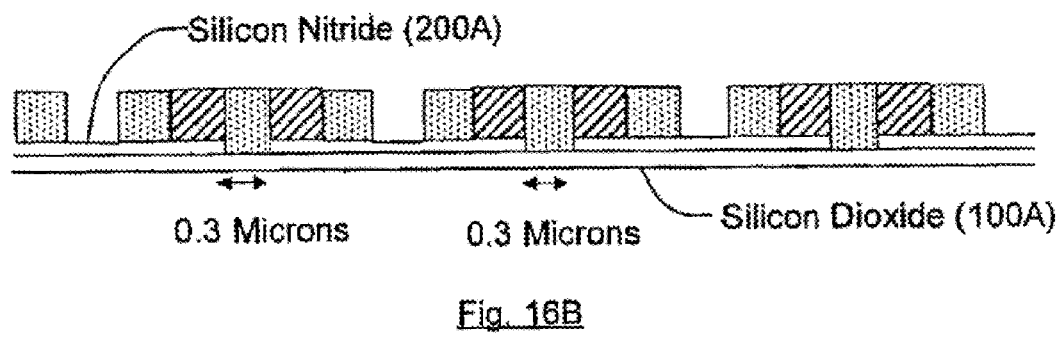

Alternatively, this process may be used to form 0.3 μm wide trenches separated by 0.3 μm wide mesas. This alternative is shown in FIGS. 16A–16E. At the stage shown in FIG. 15D a second layer of polysilicon can be deposited instead of a layer of silicon nitride. This conformal polysilicon layer is shown in FIG. 16A. The polysilicon layer is then etched to form sidewall spacers on the previously formed silicon nitride sidewall spacers, as shown in FIG. 16B. The gaps between the polysilicon spacers are about 0.3 μm wide.

Figure 16C:
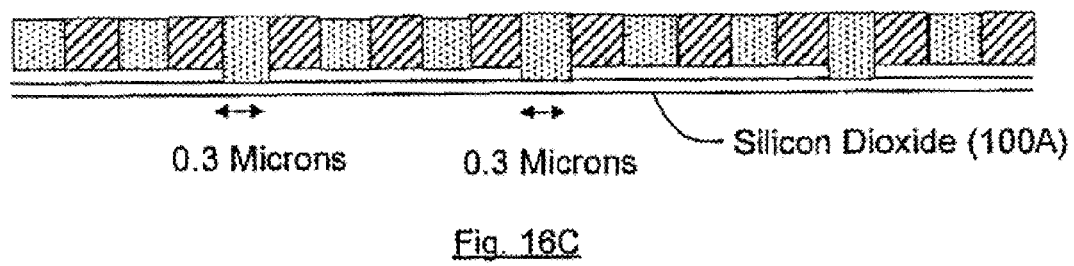
Figure 16D:
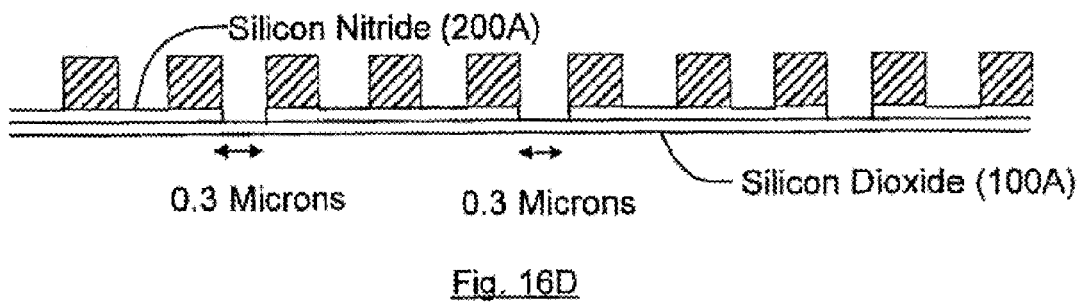

A second layer of silicon nitride is deposited and planarized to fill the gaps, producing the structure shown in FIG. 16C. The polysilicon is removed by an etch that does not affect the silicon nitride. This yields the trench mask shown in FIG. 16D, with 0.3 μm wide nitride spacers separated by 0.3 μm wide openings. Trenches are then etched through the openings to create structure shown in FIG. 16E.

It should be understood that the dimension used in the above description are illustrative only. The processes described above can be used to form trenches, mesas and other features that are otherwise beyond the capability of the semiconductor processing equipment.

Figure 17A:
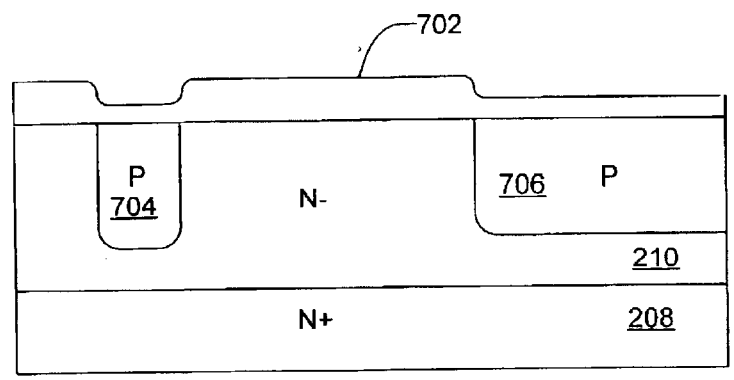
FIGS. 17A–17V illustrate a process for fabricating the JFET shown in FIG. 3.
Figure 17B:
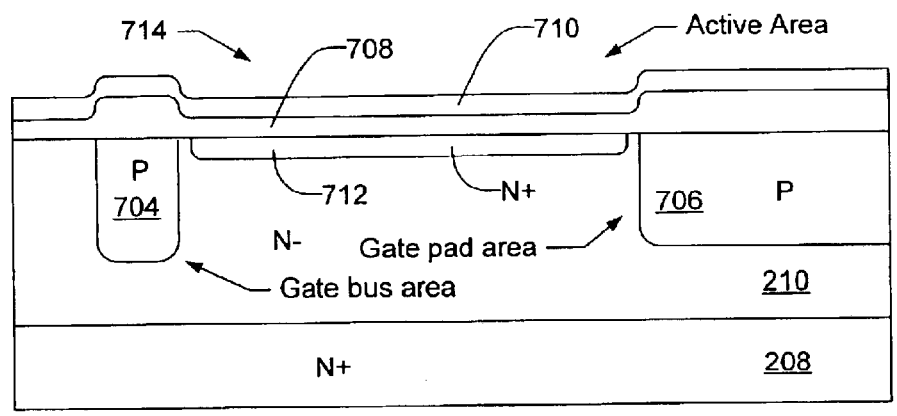
Figure 17C:
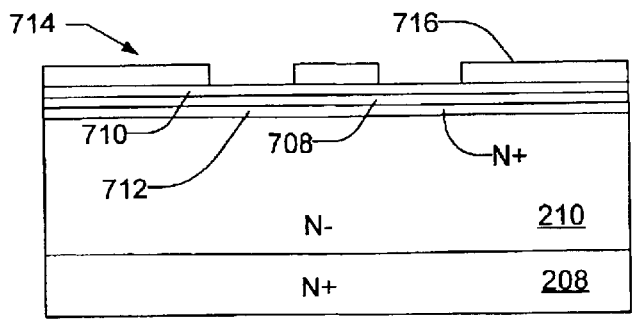
Figure 17D:
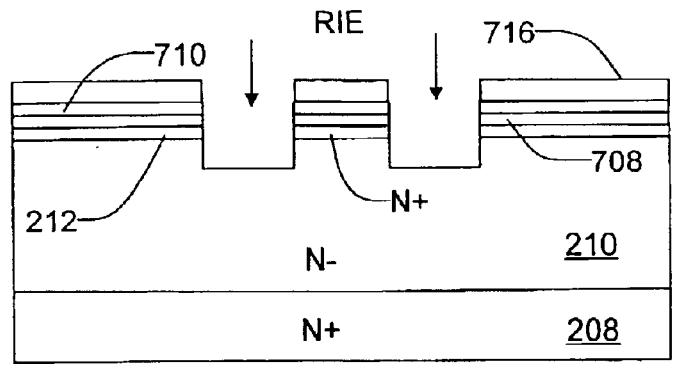
Figure 17E:
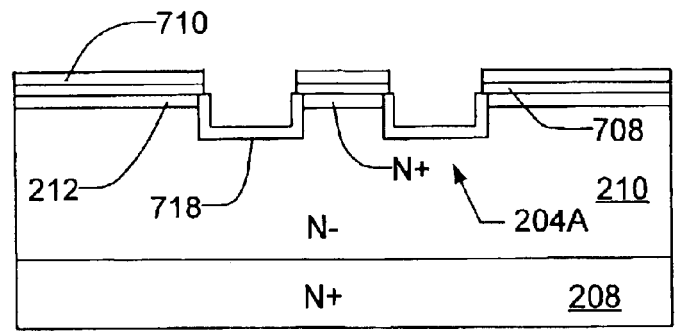
Figure 17F:
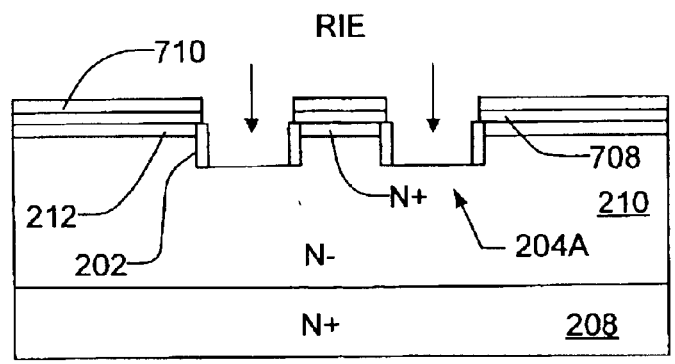
Figure 17G:
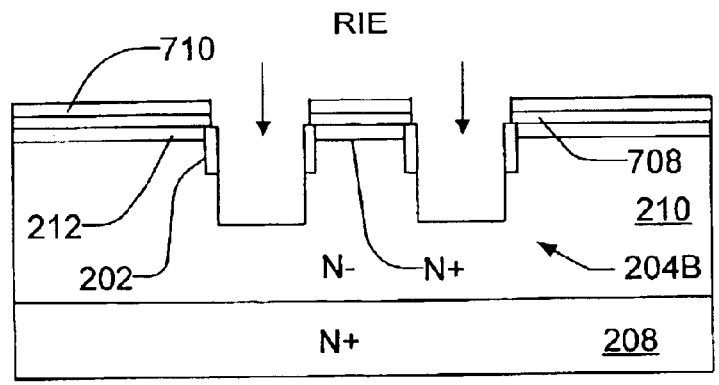
Figure 17H:
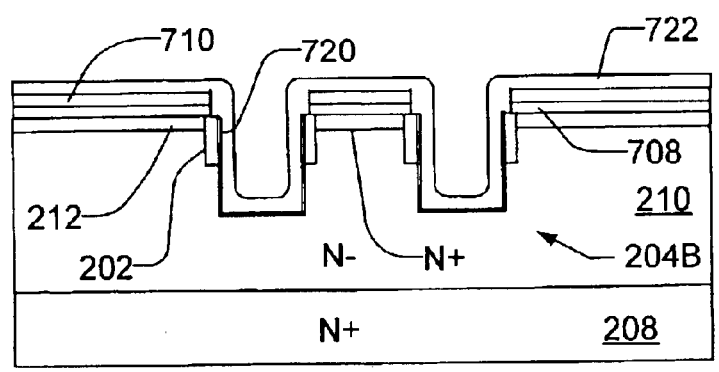
Figure 17I:
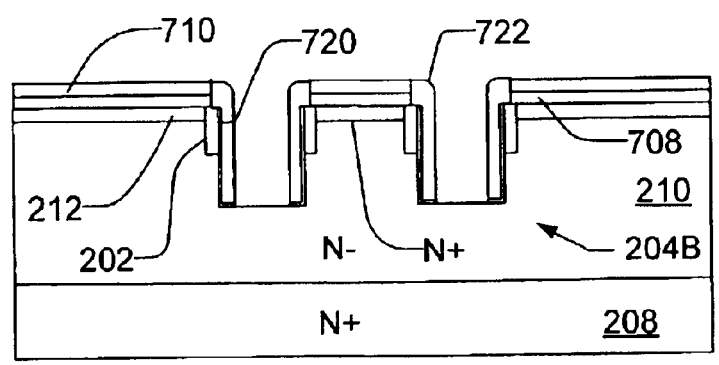
Figure 17J:
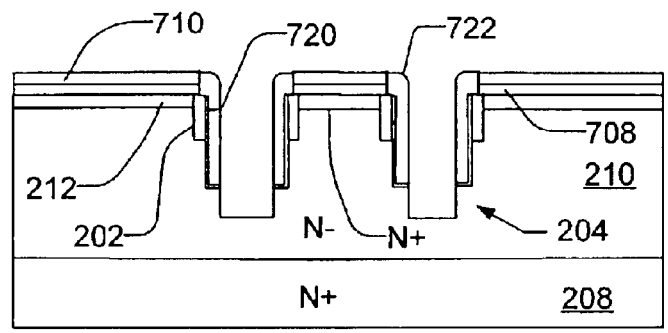
Figure 17K:
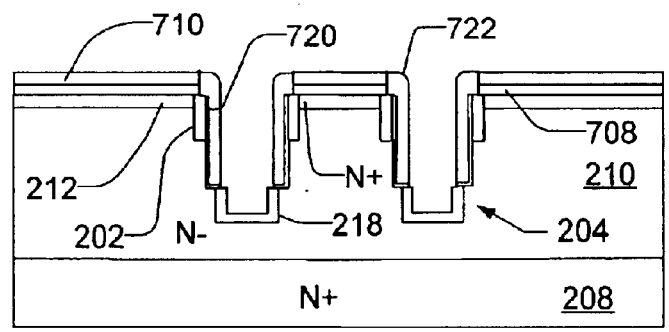
Figure 17L:
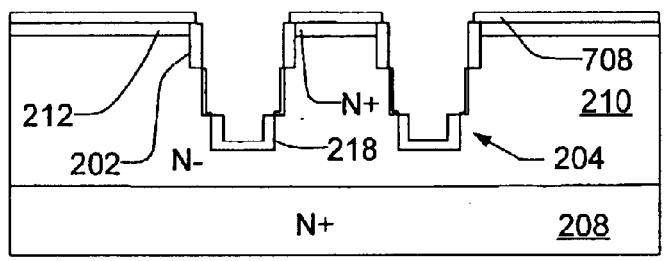
Figure 17M:
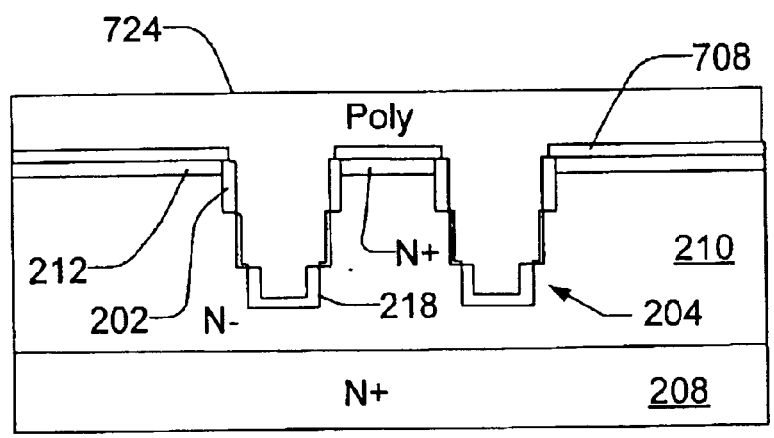
Figure 17N:
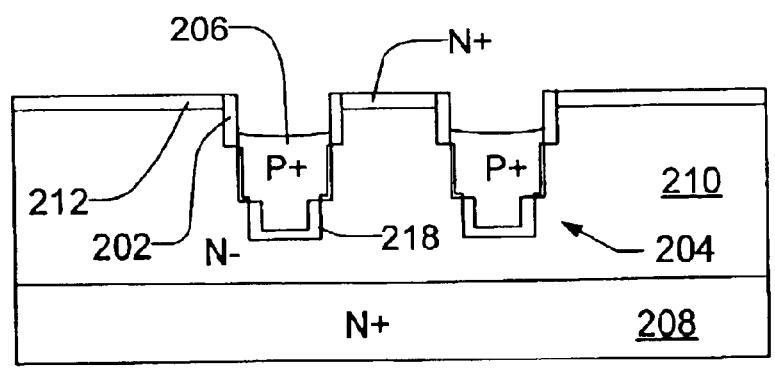
Figure 17O:
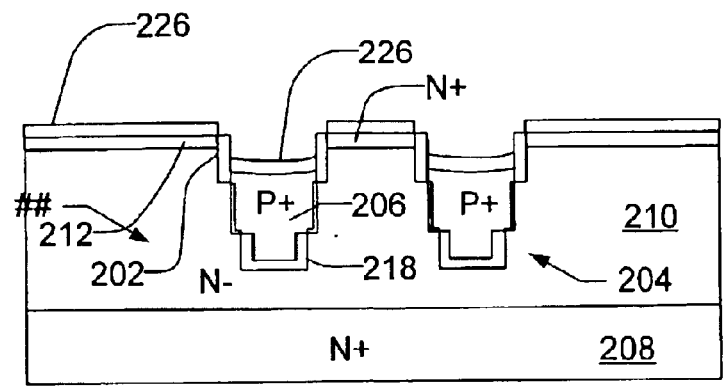
Figure 17P:
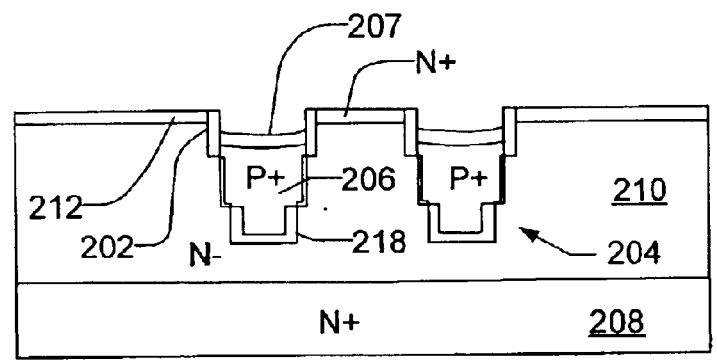
Figure 17T:
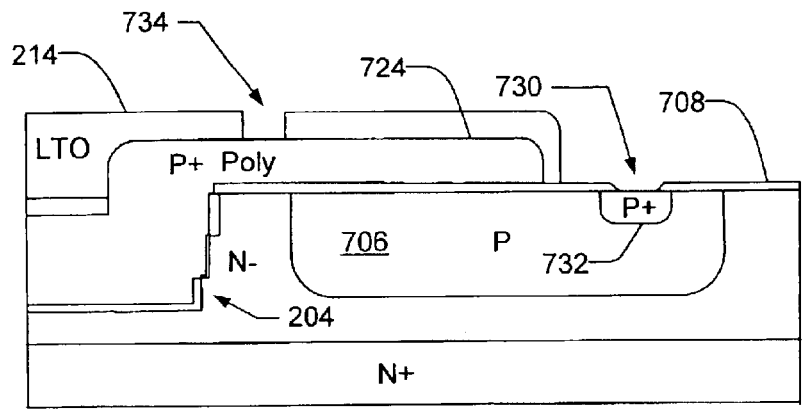
Figure 17U:
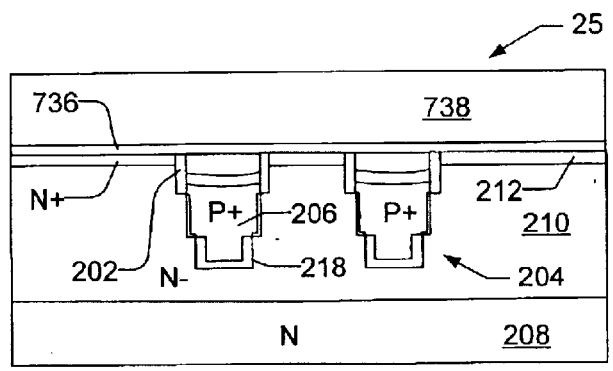
Figure 17V:
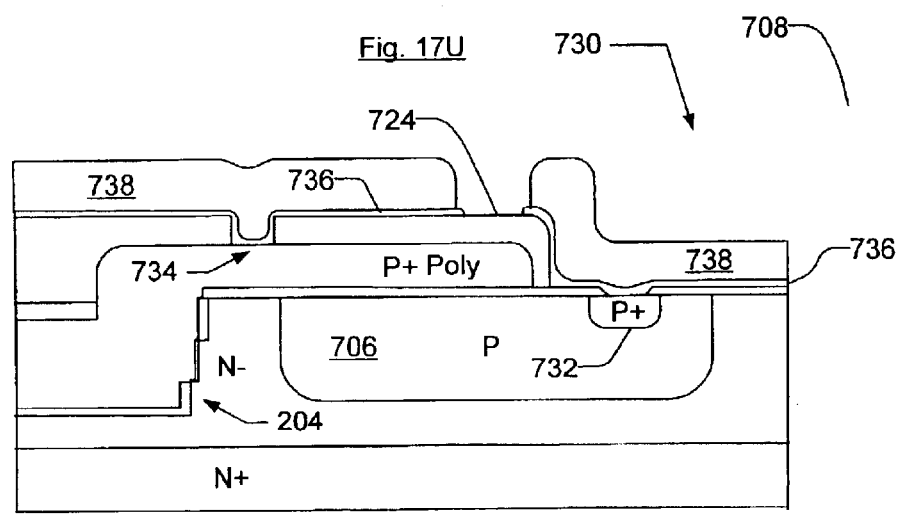

FIGS. 17A–17V illustrate a process for forming JFET 25, shown in FIG. 3. First, gate pad and gate bus regions are formed, typically in a location near the edge of the substrate. An oxide layer 702 is deposited on the surface of N− epi layer 210. A first photoresist mask (Mask 1) (not shown) is formed on the top surface of N− epi layer 210 and the mask is patterned with openings where the gate pad and gate bus regions are to be located. Boron is implanted at a dose of $1 \times 10^{12}$ to $5 \times 10^{15}$ cm$^{-2}$ and an energy of 40–250 keV, for example, to form a gate bus region 704 and a gate pad region 706. The boron implants are driven-in at about 1000° C. in a wet atmosphere. In this process, the thickness of oxide layer 702 increases to about 0.5 μm, resulting in the structure shown in FIG. 17A.

A second photoresist mask (Mask 2) (not shown) is then formed, with an opening defining the active area 714 of the chip. The oxide layer 702 is etched through the opening, and arsenic is implanted through the opening at a dose of $5 \times 10^{15}$ cm$^{-2}$ and an energy of 60 keV, to form an N+ region 712, as shown in FIG. 17B. Oxide layer 708 grows to a thickness of 100–300 Å in the active area 714. A 200–1000 Å thick silicon nitride layer 710 is deposited by CVD over oxide layer 708.

The process now focuses on the active area 714. As shown in FIG. 17C, a third photoresist mask 716 (Mask 3) is deposited on nitride layer 710 and patterned with openings where the trenches are to be located. For example, the openings might be 0.3 μm wide and be separated by 0.3 μm. Next an RIE process is used to etch through the openings in mask 716 to remove the nitride layer 710 and the oxide layer 708 and to etch trenches 204A. Trenches 204A may extend 0.4–0.5 μm into N− epi layer 210. The result is illustrated in FIG. 17D. N+ region 712 becomes the N+ source regions 212.

The foregoing assumes that the fab has the capability of producing 0.3 μm features. If this is not the case, one of the techniques described above in connection with FIGS. 14A–14H, 15A–15H and 16A–16E may be used to define the trenches.

As shown in FIG. 17E, a silicon dioxide layer 718 is thermally grown on the sides and bottom of trenches 204A. Oxide layer may be grown at 1000° C. in a wet atmosphere to a thickness of about 1000 Å. As shown in FIG. 17F, an RIE etch is used to remove oxide layer 718 from the bottoms of trenches 204A leaving trenches 204A extending about 0.5 μm into N− epi layer 210 and forming oxide spacers 202.

A third RIE etch is performed to extend the trenches another 0.5–1.0 μm into N− epi layer 210, forming trenches 204B shown in FIG. 17G.

As shown in FIG. 17H, an oxide layer 720 is grown on the sidewalls and bottoms of trenches 204B, and a silicon nitride layer 722 is deposited by CVD. Oxide layer 720 may be 50–100 Å thick and nitride layer 722 may be 200–1000 Å thick, for example.

As shown in FIG. 17I, nitride layer 722 is etched from the horizontal surfaces by a directional RIE process but is left intact on the sidewalls of trenches 204B.

Using a selective RIE process, N− epi layer 210 is etched another 0.2–0.5 μm, with nitride layers 710 and 720 serving as a mask. This forms trenches 204 and results in the structure shown in FIG. 17J.

As shown in FIG. 17K, again using nitride layers 710 and 720 as a mask, an oxide layer is grown at the bottoms of trenches 204, producing oxide spacers 218.

As shown in FIG. 17M, a layer 724 of polysilicon heavily doped with P+ ions is deposited over the substrate, filling trenches 204. As shown in FIG. 17N, polysilicon layer 724 is etched back until its top surface is at the level of the oxide spacers 202, forming P+ polysilicon gate 206. Oxide layer 708 is removed via a fourth mask (Mask 4) (not shown) from the top surface of epi layer 210 with an RIE etch, exposing N+ source regions 212.

As shown in FIG. 17O, a layer 226 of titanium is deposited and heated at 600–700° C. to form a suicide and etched from the oxide spacers 202, leaving silicide layer 226 on the surface of the N+ source regions 212 and polysilicon gate 206. A selective etchant chemistry is used to remove the titanium but not the silicide without a mask. After the formation of TiSi$_2$ at 650° C. in a non-oxygen ambient (argon), the unreacted titanium is removed using a mixture of deionized water, hydrogen peroxide (H$_2$O$_2$) and NH$_4$—OH (5:1:1) at room temperature. After the removal of the Ti, the TiSi$_2$ is stabilized at about 800° C. After the formation of the silicide, the subsequent process steps are kept below 900° C. to keep the TiSi$_2$ stable.

Alternatively, as shown in FIG. 17P, a layer 207 of a metal such as Ti/TiN, Mo or W may be deposited to a thickness of 0.1 μm, for example, and etched back to leave metal layer 207 only on the surface of the P+ polysilicon gate 206.

Figure 17Q:
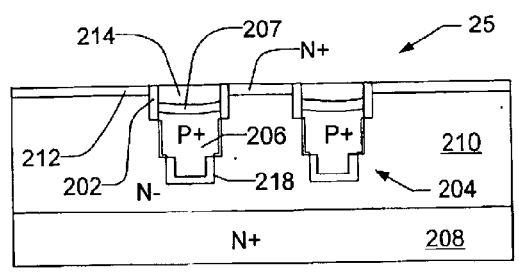

It is assumed herein that the alternative shown in FIG. 17P is selected, but regardless of which alternative is chosen, an LTO layer 214 is deposited by CVD, and the top surface of the N− epi layer 210 is planarized, resulting in the structure shown in FIG. 17Q, which is similar to JFET 25 shown in FIG. 3.

Figure 17R:
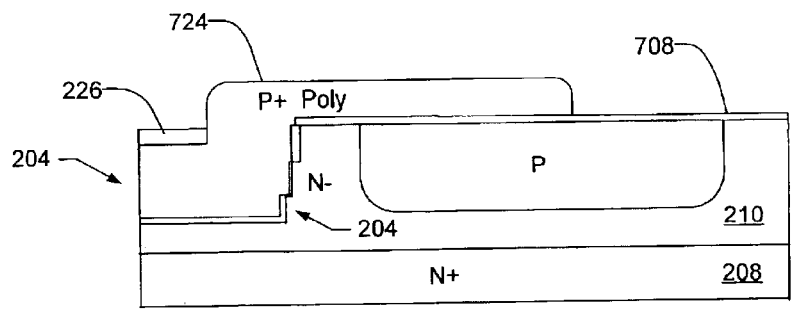

Referring again to FIGS. 17M and 17N, a mask is deposited before the polysilicon layer 724 is etched back to allow a gate contact to be formed at the top surface of the finished chip. FIG. 17R is a cross-sectional view taken at a location, typically near the edge of the chip, where the gate is allowed to come out of the trench 204, so that it may be contacted and connected to external circuitry. A mask is formed over this area before the polysilicon layer 724 is etched back into the trench 204, as shown in FIG. 17N. As a result, the polysilicon extends out of the trench and overlies the oxide layer 708.

Figure 17S:
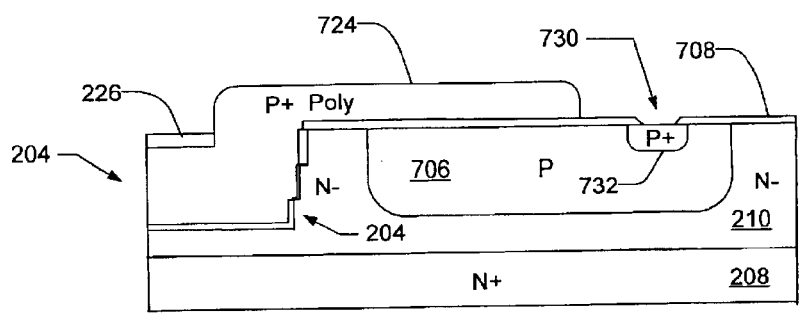

As shown in FIG. 17S, another mask is formed and an opening 730 is etched in oxide layer 708. Boron is implanted through opening 730 at a dose of 1 to $5 \times 10^{15}$ cm$^{-2}$, for example, to form a P+ contact region 732 within gate pad region 706.

As shown in FIG. 17T, LTO layer 214 is allowed to extend over P+ polysilicon layer 724 where the latter comes out of the trench 204, and LTO layer 214 is patterned and etched to form an opening 734. The gate may be contacted through opening 734.

Referring again to FIG. 17Q, titanium barrier layer 736 is deposited on the top surface of the chip, making an ohmic contact with the N+ source regions 212. Layer 736 can be 1000 Å thick, for example. A metal layer 738, preferably Al:Si:Cu, is deposited on layer 736. The resulting structure is shown in FIG. 17U. A mask (not shown) is then formed, and layers 736 and 738 are etched to separated the source metal from the gate metal.

FIG. 17V shows metal layers 736 and 738 in the gate pad region. The gate portion of metal layers 736 and 738 makes electrical contact with P+ polysilicon layer 724 through opening 734. The source portion of metal layers 736 and 738 makes contact with P gate pad region 706 via P+ contact region 732.

Those skilled in the art will understand that numerous variations of this process are possible. For example, if the gate is in a form shown in FIGS. 4–10, the material that comes out of the trench as shown in FIGS. 17R–17T may be a metal such as tungsten instead of polysilicon.

Figure 18A:
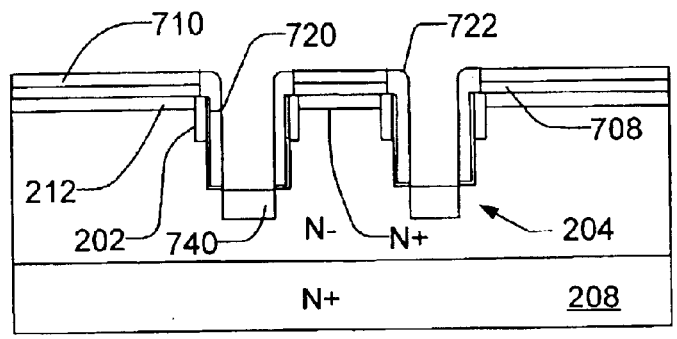
FIGS. 18A–18C show several alternatives processes for fabricating a JFET in accordance with this invention.
Figure 18B:
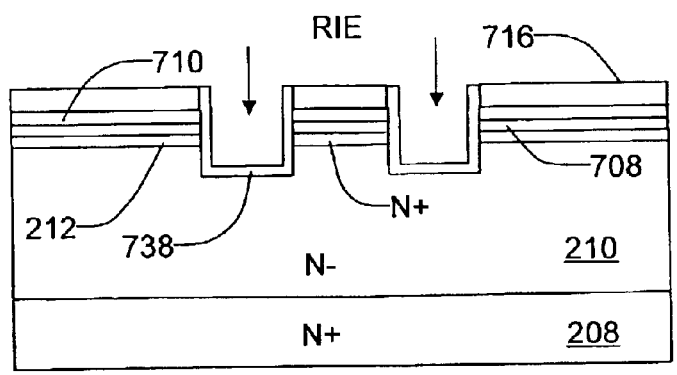

At the stage shown in FIG. 17J, an LTO layer 740 may be deposited and etched back to the bottom of the trenches 204, as shown in FIG. 18A, instead of growing a thermal oxide layer 218 at the bottom of the trenches. LTO layer 740 may be 0.1–0.2 μm thick. At the stage shown in FIG. 17D, an LTO oxide layer may be deposited to form the sidewall spacers 202. FIG. 18B shows an LTO layer 738 deposited on the sidewalls and bottoms of the trenches at the stage shown in FIG. 17D.

Figure 18C:
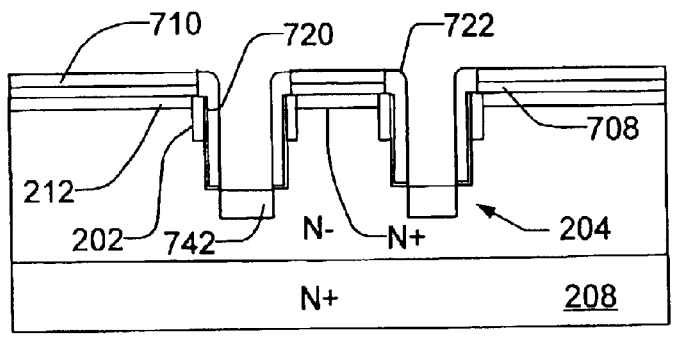

As another alternative, the insulating layer at the bottom of trenches could be made of borophosphosilicate glass (BPSG) instead of silicon oxide. FIG. 18C shows a structure that is similar to that shown in FIG. 18A, except that a BPSG layer 742 is formed at the trench bottoms. A layer of BPSG could be deposited and etched back to a thicknes of 0.1–0.2 μm.

Yet another alternative is to deposit a relatively thin layer of BPSG and reflow the layer so that is collects at the trench bottoms to form the insulating layer.

Figure 19A:
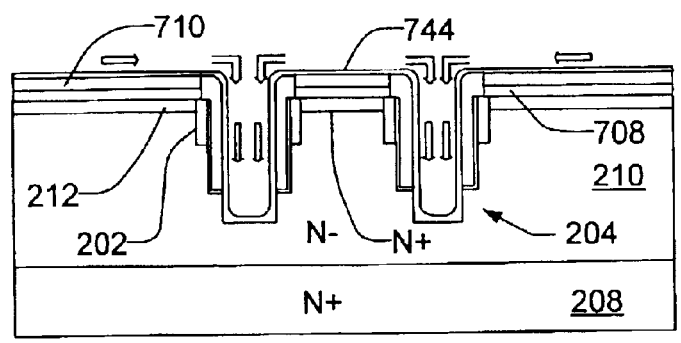
FIGS. 19A and 19B show several additional alternatives processes for fabricating a JFET in accordance with this invention.
Figure 19B:
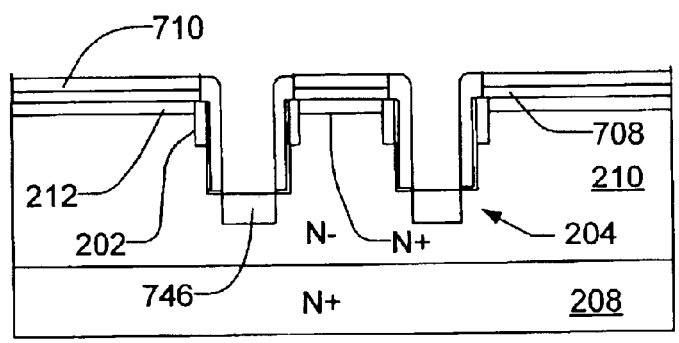

FIG. 19A shows a thin (e.g., 0.05 μm) BPSG layer 744 that is deposited over the top surface of the chip. BPSG layer 744 is heated to a temperature that is high enough to cause it to reflow into the trenches, forming insulating layers 746 as shown in FIG. 19B. After the BPSG insulating layer 746 has been formed, the gate may be fabricated using one of the processes described above.

The insulating layer at the bottom of the trench may also be formed using a SIMOX process. SIMOX is basically a high-energy and high-dose oxygen implantation process used to form a buried SiO2 layer in silicon. A high oxygen dose of about $1 \times 10^{17}$ cm$^{-2}$ at an energy of 30–40 keV will form a continuous oxide layer at the bottom of the trench. This requires a high dose ion implanter with an oxygen implant source. See S. Wolf, *Silicon Processing For The VLSI Era*, Vol. 2, page 72, Lattice Press (1990).

Figure 20:
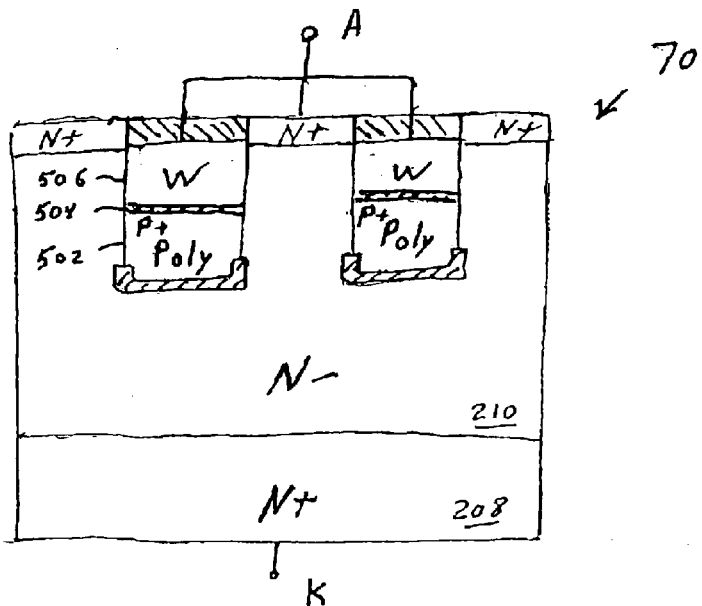
FIG. 20 shows a flyback diode in accordance with the invention.

FIG. 20 shows a flyback diode 70, in which the gate and source terminals are shorted together to form the anode terminal and the drain serves as the cathode terminal. The trenches are filled with a P+ polysilicon layer 502, a silicide layer 504 and a Schottky metal (tungsten) layer 506. When the anode is biased positive with respect to the cathode, electrons are injected from the N– epi layer 210 into the P+ polysilicon layer 502. Electrons also flow from the N– epi layer 210 into the tungsten layer 506 and into the N+ source region.

Figure 21:
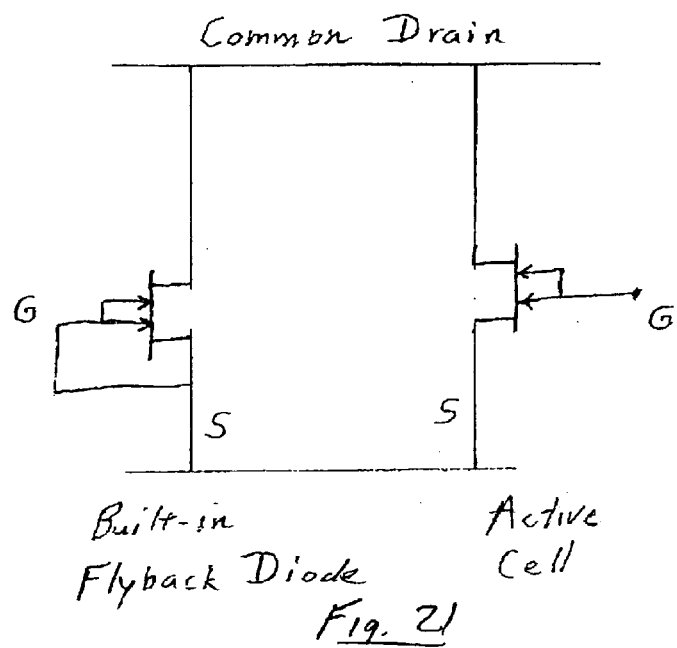
FIG. 21 is a circuit diagram of a flyback diode in parallel with an active device.
Figure 22:
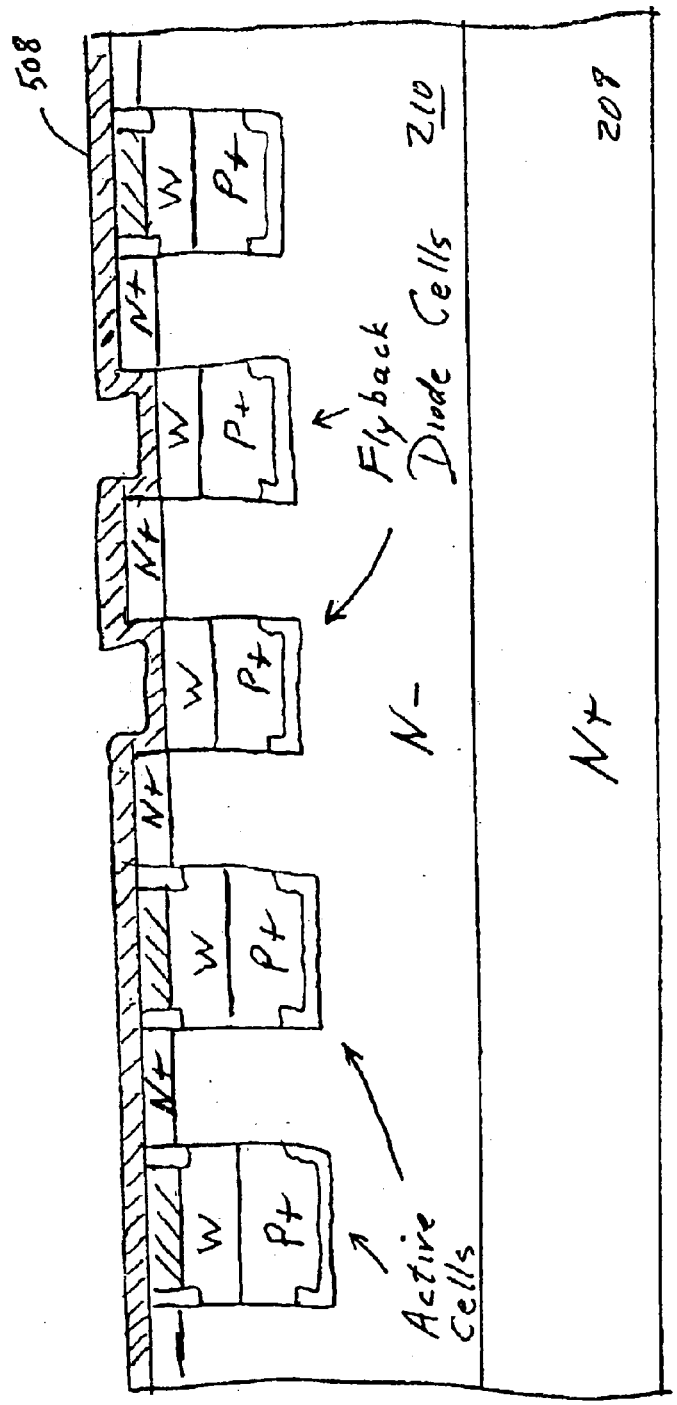
FIG. 22 shows a portion of a chip in which active JFET cells are combined with flyback diode cells to form the circuit shown schematically in FIG. 21.

FIG. 22 shows a portion of a chip in which active JFET cells are combined with flyback diode cells to form the circuit shown schematically in FIG. 21. A metal layer 508 is allowed to contact the tungsten layer in the flyback diode cells thereby establishing a short between the gate and the source terminals in the diode cells.

Figure 23:
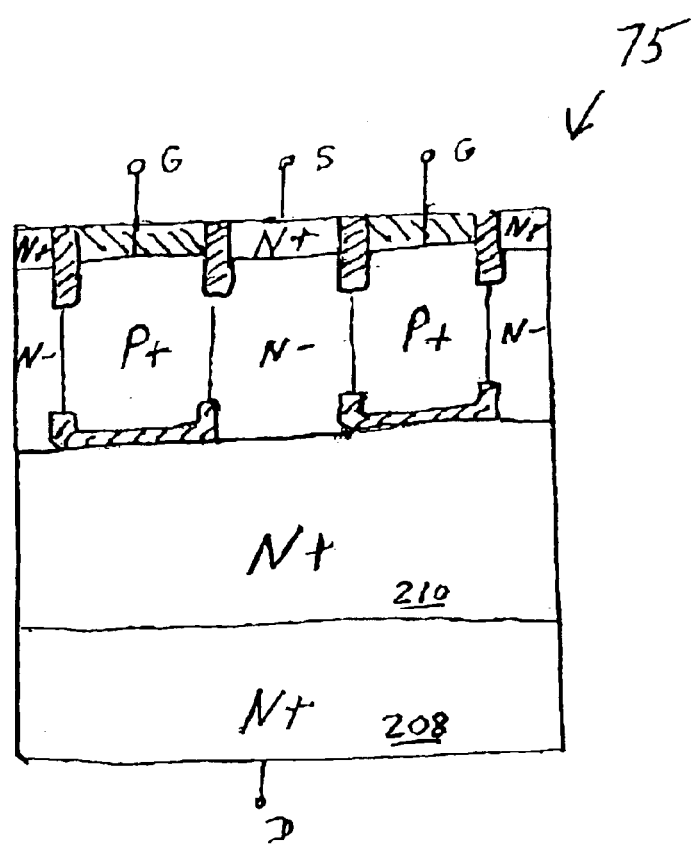
FIG. 23 shows an embodiment of the invention in the form of a bidirectional switch 75.

FIG. 23 shows an embodiment of the invention in the form of a bidirectional switch 75. The trenches are filled with P+ doped polysilicon and the heavily doped N+ drain reaches the bottom of the trenches, thus creating a device that is vertically symmetrical. The voltage locking capability of the bidirectional switch can be increased by replacing N+ region, 210 with an N– epi layer and extending the side wall dielectric spacer (SWD) more than 0.4 micron (e.g., up to 1 micron or more).

The embodiments described above are illustrative only, and not limiting. Many additional embodiments within the broad scope of this invention will be apparent to persons of skill in the art.

I claim:

1. A trench junction field-effect transistor comprising:
    a semiconductor substrate doped with impurity of a first conductivity type, the substrate forming at least part of the drain of the transistor;
    an epitaxial layer grown over the substrate, the epitaxial layer being doped with impurity of the first conductivity type and having a doping concentration generally lower than the doping concentration of the substrate;
    at least two trenches formed in the epitaxial layer, the trenches defining a mesa;
    a source region located in the mesa at a surface of the epitaxial layer, the source region being doped with impurity of the first conductivity type at a doping concentration greater than the doping concentration of the epitaxial layer generally;
    the trench including a gate, the gate comprising an electrically conductive material, the electrically conductive material of the gate being in contact with the epitaxial layer at a portion of a sidewall of each trench; and
    a dielectric sidewall spacer located at an upper portion of the sidewall of each trench.

2. The trench junction field-effect transistor of claim 1 wherein the dielectric sidewall spacer is from 500 Å to 2000 Å thick.

3. The trench junction field-effect transistor of claim 1 further comprising a bottom dielectric layer located between the gate and the epitaxial layer at a bottom of each trench and extending upward along a sidewall of each trench.

4. The trench junction field-effect transistor of claim 3 wherein the bottom dielectric layer is from 500 Å to 2000 Å thick.

5. The trench junction field-effect transistor of claim 3 wherein the gate comprises polysilicon doped with an impurity of a second conductivity type opposite to the first conductivity type.

6. The trench junction field-effect transistor of claim 5 wherein substantially the entire gate consists of polysilicon doped with an impurity of the second conductivity type.

7. The trench junction field-effect transistor of claim 3 wherein in the gate comprises a Schottky metal.

8. The trench junction field-effect transistor of claim 7 wherein the Schottky metal is a metal selected from the group consisting of tungsten, titanium, molybdenum, palladium, platinum, and aluminum.

9. The trench junction field-effect transistor of claim 7 wherein the gate comprises a central core of a Schottky metal.

10. The trench junction field-effect transistor of claim 7 wherein the gate comprises a layer of a Schottky metal overlying a layer of polysilicon doped with an impurity of the second conductivity type.

11. The trench junction field-effect transistor of claim 3 wherein substantially the entire gate consists of a Schottky metal.

12. The trench junction field-effect transistor of claim 3 wherein the length of the dielectric sidewall spacer is greater than 0.5 micron and wherein the depth of the trenches is equal to or greater than 1.5 microns to increase the reverse voltage blocking capability of the transistor.

13. The trench junction field-effect transistor of claim 1 comprising a top dielectric layer in the trench, the top dielectric layer overlying the gate.

14. The trench junction field-effect transistor of claim 13 wherein the top dielectric layer is 0.5 μm or less thick.

15. The trench junction field-effect transistor of claim 1 comprising a region of a second conductivity type opposite to the first conductivity type, the region being located in the epitaxial layer adjacent a bottom of each trench.

16. The trench junction field-effect transistor of claim 15 wherein the gate comprises polysilicon doped with an impurity of the second conductivity type.

17. The trench junction field-effect transistor of claim 15 wherein the gate comprises a metal selected from the group consisting of tungsten, titanium, molybdenum, platinum, palladium, and aluminum.

18. The trench junction field-effect transistor of claim 1 comprising a plurality of transistor cells, each cell being in the form of a stripe.

19. The trench junction field-effect transistor of claim 1 comprising a plurality of closed transistor cells, each cell being in a shape selected from the group consisting of squares, hexagons and circles.

20. A method of fabricating a junction field-effect transistor comprising:

providing a semiconductor substrate of a first conductivity type;

growing an epitaxial layer of the first conductivity type on the substrate;

directionally etching the epitaxial layer to form at least two relatively shallow trenches in the epitaxial layer, the trenches between separated by a mesa;

forming dielectric sidewall spacers on the walls of the relatively shallow trenches;

directionally etching the epitaxial layer so as to form deeper trenches while leaving the dielectric sidewall spacers remaining on the walls of the relatively shallow trenches;

depositing a first dielectric layer inside the deeper trenches;

directionally etching the first dielectric layer from the bottoms of the deeper trenches while leaving the first dielectric layer on sidewalls of the deeper trenches;

directionally etching the epitaxial layer at the bottoms of the deeper trenches to form extensions of the deeper trenches;

forming a bottom dielectric layer on the bottoms and sidewalls of the extensions;

removing remaining portions of the first dielectric layer;

introducing a conductive material into the deeper trench; and forming a source region of the first conductivity type at a top of the mesa.

21. The method of claim 20 wherein forming dielectric sidewall spacers on the walls of the relatively shallow trenches comprises growing an oxide layer.

22. The method of claim 20 wherein forming dielectric sidewall spacers on the walls of the relatively shallow trenches comprises depositing a dielectric layer by chemical vapor deposition.

23. The method of claim 20 wherein forming dielectric sidewall spacers on the walls of the relatively shallow trenches comprises growing an oxide layer.

24. The method of claim 20 wherein forming a bottom dielectric layer on the bottoms and sidewalls of the extensions comprises growing an oxide layer.

25. The method of claim 20 wherein forming a bottom dielectric layer on the bottoms and sidewalls of the extensions comprises chemical vapor deposition.

26. The method of claim 20 wherein forming a bottom dielectric layer on the bottoms and sidewalls of the extensions comprises depositing and re-flowing a glass layer.

27. A method of forming a trench in a semiconductor material comprising:

forming a first layer over a surface of the semiconductor material;

patterning and etching the first layer so as to leave at least two remaining segments of the first layer, the at least two remaining segments being separated by a gap;

depositing a second layer conformally over the at least two remaining segments and the gap;

directionally etching the second layer so as to leave first spacers on the sidewalls of the at least two remaining segments of the first layer, the first spacers being separated by a first smaller gap; and etching the substrate through the first smaller gap to form a trench.

28. The method of claim 27 further comprising:

filling the first smaller gap with a third layer;

removing the at least two remaining segments;

depositing a fourth layer conformally over the third layer and the first spacers;

directionally etching the fourth layer so as to leave second spacers on the sidewalls of the first spacers, the second spacers being separated by a second smaller gap; and etching the substrate through the second smaller gap to form a second trench.

29. The method of claim 27 wherein the at least two remaining segments of the first layer are separated by a distance approximately equal to twice the width of the first smaller gap.

30. The method of claim 27 wherein the at least two remaining segments of the first layer are separated by a distance approximately equal to three times the width of the first smaller gap.

31. A method of forming a trench in a semiconductor material comprising:

forming a first layer over a surface of the semiconductor material;

patterning and etching the first layer so as to leave at least two remaining segments of the first layer, the at least two remaining segments being separated by a gap;

depositing a second layer conformally over the at least two remaining segments and the gap;

directionally etching the second layer so as to leave first spacers on the sidewalls of the at least two remaining segments of the first layer, the first spacers being separated by a first smaller gap; and filling the first smaller gap with a third layer;

removing the at least two remaining segments;

depositing a fourth layer conformally over the third layer and the first spacers, the fourth layer comprising the same material as the third layer;

directionally etching the fourth layer so as to leave second spacers on the sidewalls of the first spacers, the second spacers being separated by a second smaller gap;

filling the second smaller gap with a fifth layer, the fifth layer comprising the same material as the second layer;

removing the third and fourth layers to produce at least a third smaller gap; and etching the substrate through the at least third smaller gap to form a second trench.

* * * * *

UNITED STATES PATENT AND TRADEMARK OFFICE
CERTIFICATE OF CORRECTION

PATENT NO. : 6,878,993 B2
APPLICATION NO. : 10/327325
DATED : April 12, 2005
INVENTOR(S) : Hamza Yilmaz It is certified that error appears in the above-identified patent and that said Letters Patent is hereby corrected as shown below:

Delete Drawing Sheet 12 of 29 and substitute therefore the attached Drawing Sheet 12 of 29.

Signed and Sealed this

Fifth Day of August, 2008

JON W. DUDAS
*Director of the United States Patent and Trademark Office*